United States Patent
Rhee et al.

(10) Patent No.: US 9,679,761 B2
(45) Date of Patent: Jun. 13, 2017

(54) METHOD FOR PREPARING A NANOPOROUS ULTRA-LOW DIELECTRIC THIN FILM INCLUDING A HIGH-TEMPERATURE OZONE TREATMENT AND A NANOPOROUS ULTRA-LOW DIELECTRIC THIN FILM PREPARED BY THE SAME METHOD

(75) Inventors: Hee Woo Rhee, Seoul (KR); Bo Ra Shin, Seoul (KR); Kyu Yoon Choi, Seoul (KR); Bum Suk Kim, Seoul (KR)

(73) Assignees: INDUSTRY-UNIVERSITY COOPERATION FOUNDATION, Seoul (KR); SOGANG UNIVERSITY, Seoul (KR)

( * ) Notice: Subject to any disclaimer, the term of this patent is extended or adjusted under 35 U.S.C. 154(b) by 0 days.

(21) Appl. No.: 13/570,596

(22) Filed: Aug. 9, 2012

(65) Prior Publication Data

US 2013/0101825 A1  Apr. 25, 2013

Related U.S. Application Data

(63) Continuation of application No. PCT/KR2011/000865, filed on Feb. 9, 2011.

(30) Foreign Application Priority Data

Feb. 9, 2010  (KR) .................. 10-2010-0011830

(51) Int. Cl.
| | |
|---|---|
| B05D 3/04 | (2006.01) |
| H01L 21/02 | (2006.01) |
| C23C 18/12 | (2006.01) |
| B32B 5/00 | (2006.01) |

(52) U.S. Cl.
CPC .......... *H01L 21/02123* (2013.01); *B32B 5/00* (2013.01); *C23C 18/122* (2013.01);
(Continued)

(58) Field of Classification Search
CPC ... B32B 5/00; C23C 18/1212; C23C 18/1279; C23C 18/122; H01L 21/02126;
(Continued)

(56) References Cited

U.S. PATENT DOCUMENTS

| | | | |
|---|---|---|---|
| 7,208,389 B1 * | 4/2007 | Tipton et al. | 438/409 |
| 2004/0213911 A1 | 10/2004 | Misawa et al. | |

(Continued)

FOREIGN PATENT DOCUMENTS

| | | |
|---|---|---|
| CN | 101312129 A | 11/2008 |
| CN | 101575700 A | 11/2009 |

(Continued)

OTHER PUBLICATIONS

Machine Translation of KR10-2006-0117563, which was published Jan. 2007.*

(Continued)

*Primary Examiner* — Robert S Walters, Jr.
(74) *Attorney, Agent, or Firm* — Brundidge & Stanger, P.C.

(57) ABSTRACT

The present invention provides a method for preparing a nanoporous ultra-low dielectric thin film including a high-temperature ozone treatment and nanoporous ultra-low dielectric thin film prepared by the same method. The method includes preparing a mixture of an organic silicate matrix-containing solution and a reactive porogen-containing solution; coating the mixture on a substrate to form a thin film; and heating the thin film with an ozone treatment. The prepared nanoporous ultra-low dielectric thin film could have a dielectric constant of about 2.3 or less and a mechanical strength of about 10 GPa or more by improving a pore size and a distribution of pores in the thin film by performing an ozone treatment with high temperature and optimization of the ozone treatment temperature.

5 Claims, 25 Drawing Sheets

(52) U.S. Cl.
CPC ...... *C23C 18/1212* (2013.01); *C23C 18/1279* (2013.01); *H01L 21/02126* (2013.01); *H01L 21/02203* (2013.01); *H01L 21/02216* (2013.01); *H01L 21/02282* (2013.01); *H01L 21/02323* (2013.01); *H01L 21/02337* (2013.01); *Y10T 428/249953* (2015.04)

(58) Field of Classification Search
CPC ......... H01L 21/02282; H01L 21/02123; H01L 21/02216; H01L 21/02337; H01L 21/02203; H01L 21/02323
USPC ........................................................ 427/384
See application file for complete search history.

(56) References Cited

U.S. PATENT DOCUMENTS

2005/0260420 A1 11/2005 Collins et al.
2008/0118995 A1 5/2008 Tamboli et al.
2008/0241377 A1* 10/2008 Faguet ................. C23C 16/452
427/248.1

FOREIGN PATENT DOCUMENTS

| JP | 2004-311532 A | 11/2004 |
| JP | 2004-312004 A | 11/2004 |
| JP | 2008-199028 A | 8/2008 |
| KR | 10-2003-0082479 | 10/2003 |
| KR | 10-2005-0052710 | 6/2005 |
| KR | 10-2008-0045077 | 5/2008 |
| KR | 10-2008-0076847 | 8/2008 |

OTHER PUBLICATIONS

International Search Report from International Application No. PCT/KR2011/000865 mailed Oct. 24, 2011.

* cited by examiner

METHOD FOR PREPARING A NANOPOROUS ULTRA-LOW DIELECTRIC THIN FILM INCLUDING A HIGH-TEMPERATURE OZONE TREATMENT AND A NANOPOROUS ULTRA-LOW DIELECTRIC THIN FILM PREPARED BY THE SAME METHOD

CROSS-REFERENCE TO RELATED APPLICATION

This application is a Continuation of International Application No. PCT/KR2011/000865 filed Feb. 9, 2011, which claims the benefits of Korean Patent Application No. 10-2010-0011830 filed Feb. 9, 2010. The entire disclosure of the prior application is incorporated herein by reference in its entirety.

TECHNICAL FIELD

The present invention relates to a method for preparing a nanoporous ultra-low dielectric thin film including a high-temperature ozone treatment and a nanoporous ultra-low dielectric thin film prepared by the same method. To be more specific, the present invention relates to a method for preparing a nanoporous ultra-low dielectric thin film having a low dielectric constant, a high mechanical strength, and a high elastic modulus by improving a pore size and a distribution of pores in a prepared ultra-low dielectric thin film by performing an ozone treatment with an optimum temperature during a heating process for preparing the ultra-low dielectric thin film, and a nanoporous ultra-low dielectric thin film prepared by the same method.

BACKGROUND ART

A non-memory semiconductor market accounts for about 78% of the global semiconductor market and continues growing. Unlike memory semiconductors subject to frequent fluctuations in price, non-memory semiconductors are less subject to fluctuation in price and are high value-added products. However, the non-memory semiconductors are manufactured by high-level techniques. Thus, until now, Korean manufacturers have intensively fostered the memory semiconductor industry capable of mass production in small variety with relatively lower-level techniques. Accordingly, Korea's memory manufacturing techniques are among the highest level in the world and Korean memory semiconductors account for about 40% or more of the global memory semiconductor market. However, the memory semiconductor market is already saturated and the price has dropped. This means that the Korean manufacturers should advance into a new business area. Therefore, an advance into the non-memory semiconductor market is important to the Korean manufacturers for securing competitiveness in the global semiconductor market.

In manufacturing a non-memory semiconductor device, a wiring process is most important. As a semiconductor device has been highly integrated with higher speed and a multi-layer interconnecting process has been miniaturized, a line width in wiring has been rapidly decreased. However, a decrease in line width in wiring within an ultra large scale integrated circuit semiconductor device causes a signal delay (RC delay) depending on an electrostatic capacitance (C) between metal wires and a resistance (R) of wiring metal and a decrease in operation speed of the entire device. Actually, when a semiconductor device of 130 nm or less is manufactured with existing aluminum and an insulating material such as a silicon oxide ($SiO_2$) film, there is a decrease in data processing speed due to resistivity of the aluminum and a high dielectric constant of the oxide film. For this reason, a study on Cu/low-k integration using copper having a high electric conductivity for wiring and using a low-k material as an insulating material has been carried out. As for a logic device of 90 nm being produced in large quantities, Cu/low-k material has been used instead of $Al/SiO_2$. As a Cu wiring process has been performed with higher density, an ultra low-k material to be used for devices of 50 nm or less and 40 nm or less needs to be developed.

A low-k material has been used as an interlayer insulating material for the last several years and contributed to development in the semiconductor industry. However, due to high integration with high speed continuously required for a semiconductor device, there has been a demand for a development of a new material which can be substituted for the existing low-k material and has a lower dielectric constant. A nanoporous ultra-low dielectric material has been expected as a new material, but has weak mechanical and electrical properties due to pores for reducing a dielectric constant.

DISCLOSURE OF THE INVENTION

Problems to be Solved by the Invention

In view of the foregoing, the present invention provides a method for preparing a nanoporous ultra-low dielectric thin film having a low dielectric constant and a high mechanical strength by means of a high-temperature ozone treatment and a nanoporous ultra-low dielectric thin film prepared by the same method.

However, the problems to be solved by the present invention are not limited to the above description and other problems can be clearly understood by those skilled in the art from the following description.

Means for Solving the Problems

In accordance with an aspect of the present invention, there is provided a method for preparing a nanoporous ultra-low dielectric thin film, the method including: preparing a mixture of an organic silicate matrix-containing solution and a reactive porogen-containing solution; coating the mixture on a substrate to form a thin film; curing the thin film; and heating a cured thin film with an ozone treatment.

In accordance with an illustrative embodiment, the organic silicate matrix may include a copolymer of alkyltrialkoxysilane and bis(trialkoxysilyl)alkane, but not limited thereto. The organic silicate matrix can be prepared by using various organic silicate precursors known in the art.

In the bis(trialkoxysilyl)alkane, the alkoxy and alkane may have 1 to 6 carbon atoms. As a non-limiting example, the bis(trialkoxysilyl)alkane may include, but is not limited to, bis(trimethoxysilyl)methane, bis(triethoxysilyl)methane, bis(trimethoxysilyl)ethane, and bis(triethoxysilyl)ethane. In the alkyltrialkoxysilane, the alkoxy and alkyl may have 1 to 6 carbon atoms. As a non-limiting example, the alkyltrialkoxysilane may include, but is not limited to, methyltrimethoxysilane, methyltriethoxysilane, ethyltrimethoxysilane, and ethyltriethoxysilane.

As a non-limiting example, the bis(trialkoxysilyl)ethane may include, but is not limited to, bis(trimethoxysilyl)ethane and bis(triethoxysilyl)ethane. As a non-limiting example, the methyltrialkoxysilane may include, but is not limited to, methyltrimethoxysilane and methyltriethoxysilane.

In the bis(trialkoxysilyl)alkane, the alkoxy and alkane may have 1 to 6 carbon atoms. As a non-limiting example, the bis(trialkoxysilyl)alkane may include, but is not limited to, bis(trimethoxysilyl)methane, bis(triethoxysilyl)methane, bis(trimethoxysilyl)ethane, and bis(triethoxysilyl)ethane. In the alkyltrialkoxysilane, the alkoxy and alkyl may have 1 to 6 carbon atoms. As a non-limiting example, the alkyltrialkoxysilane may include, but is not limited to, methyltrimethoxysilane, methyltriethoxysilane, ethyltrimethoxysilane, and ethyltriethoxysilane.

In accordance with an illustrative embodiment, the reactive porogen is one of pore generating materials which can be employed without limitation from those known in the art. By way of example, the reactive porogen may include a compound selected from the group consisting of a glass polyol-based compound, a reducing sugar-based compound, and combinations thereof, a hydroxyl end group of the compound being substituted by a trialkoxysilylalkyl group, but not limited thereto. By way of example, the reactive porogen may include, but is not limited to, a compound selected from a group including a glass polyol-based compound such as cyclodextrin, glucose, pentaerythritol, dipentaerythritol, and tripentaerythritol, a reducing sugar-based compound such as erythritol, (meso)erythritol, xylitol, and (D)manitol, and combinations thereof, a hydroxyl end group of the compound being substituted by a trialkoxysilylalkyl group (for example, a trimethoxysilylpropyl group or a triethoxysilylpropyl group), or combinations thereof.

In accordance with an illustrative embodiment, the mixture may contain the reactive porogen-containing solution of about 60 volume % or less, for example, but not limited to, from about 20 volume % to about 60 volume %, with respect to the organic silicate matrix-containing solution.

In accordance with an illustrative embodiment, the coating the mixture may be performed by spin coating, but not limited thereto.

In accordance with an illustrative embodiment, the ozone treatment may be performed at a temperature of about 100° C. or more, for example, but not limited to, from about 100° C. to about 250° C., from about 100° C. to about 200° C., from about 100° C. to about 150° C. or from about 100° C. to about 130° C.

Even if the ozone treatment is performed for a short time, it is possible to achieve the effect of the present invention due to high reactivity of ozone. A time period for the ozone treatment is not specifically limited. By way of example, the ozone treatment may be performed for a short time of, but not limited to, about 0.1 second or more.

In accordance with an illustrative embodiment, the heating may include a curing process, but not limited thereto. By way of example, the heating may include: a first curing process to remove a solvent and to induce a condensation reaction of the organic silicate matrix; a second curing process performed at a temperature higher than the first curing process to introduce a nanopore and to increase a curing density; and a final heating process performed at a temperature higher than the second curing process, but not limited thereto.

In accordance with another aspect of the present invention, there is provided a nanoporous ultra-low dielectric thin film prepared by the above-described method.

The nanoporous ultra-low dielectric thin film may have a dielectric constant of about 2.3 or less, an elastic modulus of about 10 GPa or more, and a hardness of about 1.2 GPa or more, but not limited thereto.

Details of the above-described matters will be more clearly understood with reference to the accompanying drawings and the following examples.

However, the present invention is not limited to the following examples and can be modified and changed in various ways. The following examples complete the present invention and are helpful for those skilled in the art to clearly understand the scope of the present invention.

Effect of the Invention

A nanoporous ultra-low dielectric thin film prepared in accordance with an example of the present invention is ozone-treated at a high temperature, and thus, the nanoporous ultra-low dielectric thin film has a low dielectric constant and a high mechanical strength. The nanoporous ultra-low dielectric thin film in accordance with the present invention has a dielectric constant of about 2.3 or less, an elastic modulus of about 10 GPa or more, and a hardness of about 1.2 GPa or more. The nanoporous ultra-low dielectric thin film having such properties can be applied to a next-generation semiconductor of 36 nm or more, and is superior to any other ultra-low dielectric materials developed so far.

Figure 13:
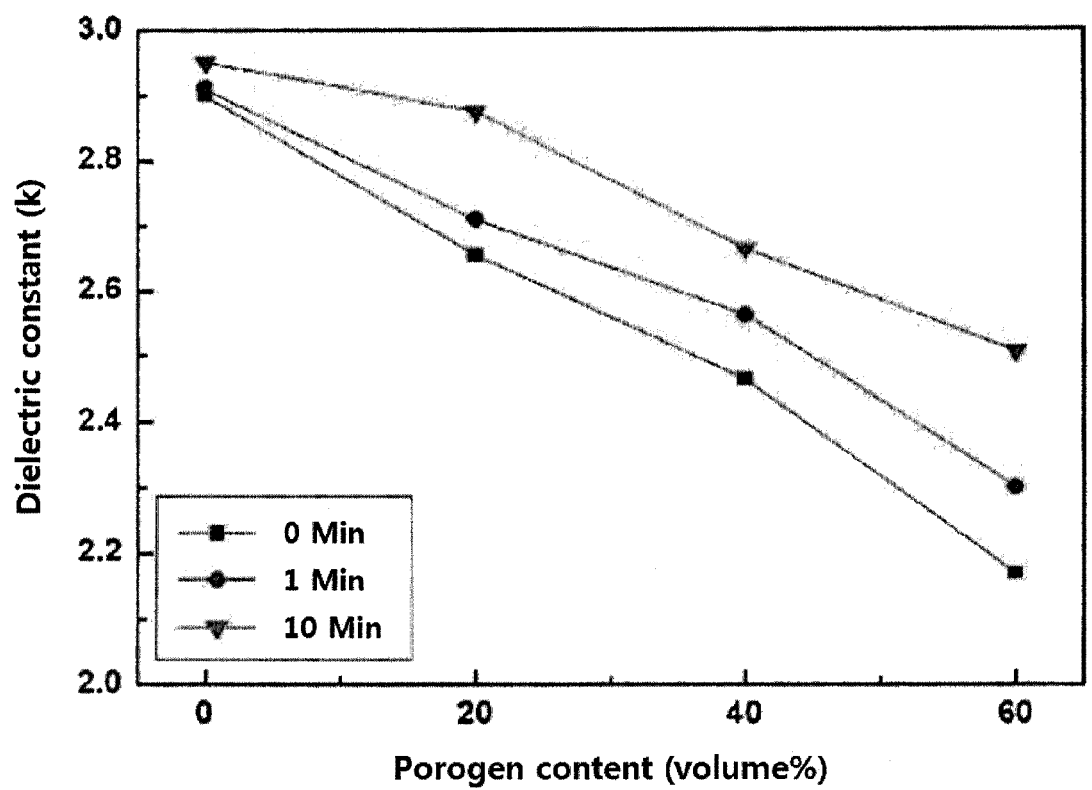

(b), about 40 volume % (c), or about 60 volume % (d) (an area ratio of a network and a cage structure) in accordance with an example of the present invention;

FIG. 12 provides graphs each showing a relative ratio of a network and a cage structure of an ultra-low dielectric thin film containing a matrix (a) or a porogen of about 20 volume % (b), about 40 volume % (c), or about 60 volume % (d) in accordance with an example of the present invention; and FIG. 13 is a graph showing a dielectric constant depending on an ozone treatment time of an ultra-low dielectric thin film and a porogen content therein in accordance with an example of the present invention.

BEST MODE FOR CARRYING OUT THE INVENTION

Hereinafter, examples of the present invention will be described in detail with reference to the accompanying drawings so that the present invention may be readily implemented by those skilled in the art. However, it is to be noted that the present invention is not limited to the examples but can be embodied in various other ways. In drawings, parts irrelevant to the description are omitted for the simplicity of explanation, and like reference numerals denote like parts through the whole document.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Figure 1:
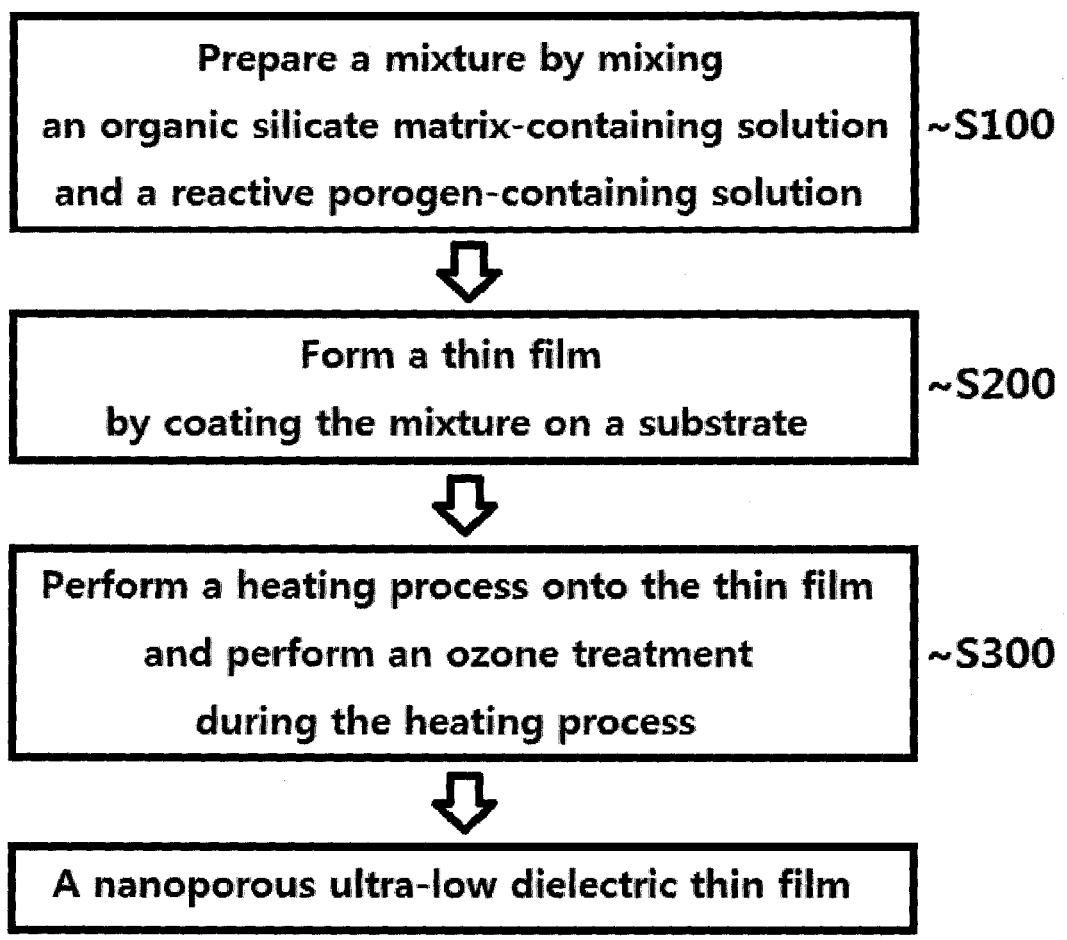
FIG. 1 is a flow chart that schematically shows a method for preparing a nanoporous ultra-low dielectric thin film in accordance with an example of the present invention.
Figure 2:
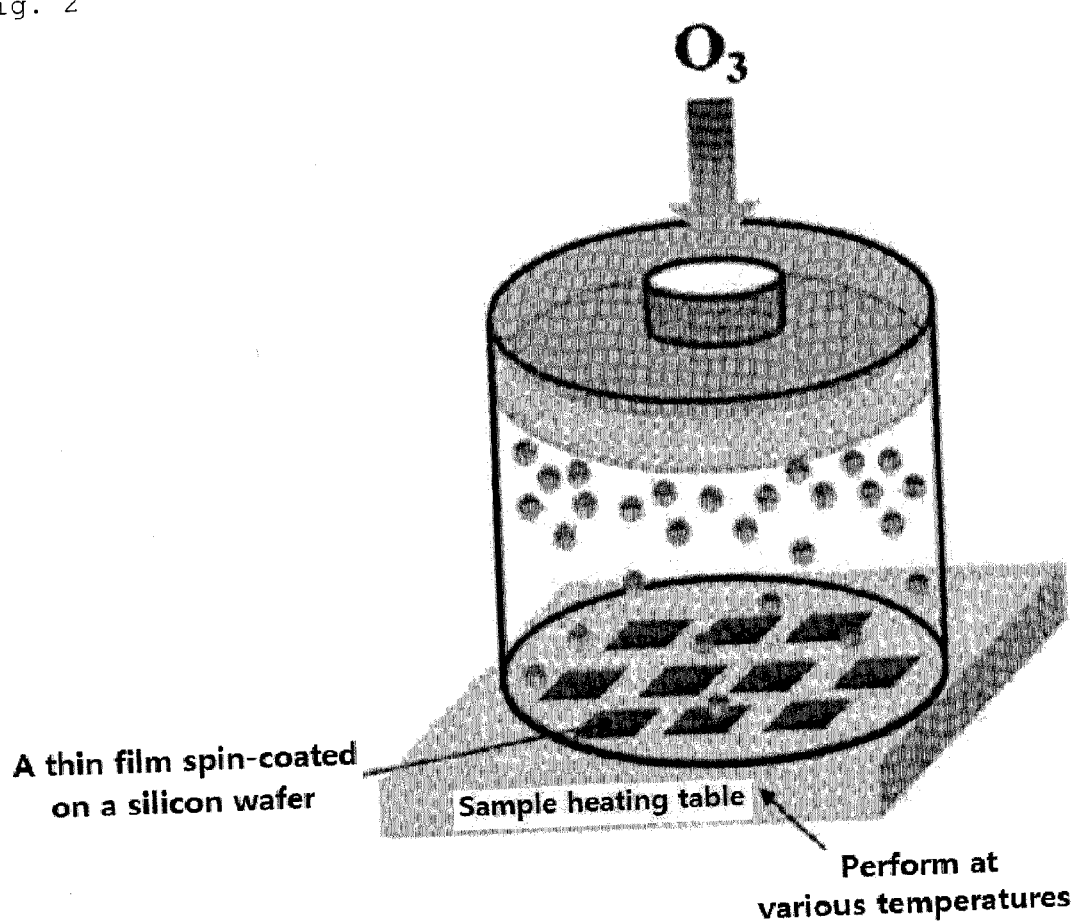
FIG. 2 is a diagram showing an ozone treatment in accordance with an example of the present invention.

Hereinafter, a method for preparing a nanoporous ultra-low dielectric thin film in accordance with the present invention will be explained in detail with reference to the accompanying drawing of FIG. 1

First, an organic silicate matrix-containing solution and a reactive porogen-containing solution are mixed to prepare a mixture thereof (S100).

The organic silicate matrix may include, but is not limited to, a copolymer of alkyltrialkoxysilane and bis(trialkoxysilyl)alkane. The organic silicate matrix can be prepared by using various organic silicate precursors known in the art.

In the bis(trialkoxysilyl)alkane, the alkoxy and alkane may have 1 to 6 carbon atoms. As a non-limiting example, the bis(trialkoxysilyl)alkane may include, but is not limited to, bis(trimethoxysilyl)methane, bis(triethoxysilyl)methane, bis(trimethoxysilyl)ethane, and bis(triethoxysilyl)ethane. In the alkyltrialkoxysilane, the alkoxy and alkyl may have 1 to 6 carbon atoms. As a non-limiting example, the alkyltrialkoxysilane may include, but is not limited to, methyltrimethoxysilane, methyltriethoxysilane, ethyltrimethoxysilane, and ethyltriethoxysilane.

The reactive porogen is one of pore generating materials which can be employed without limitation from those known in the art. By way of example, the reactive porogen may include a compound selected from a group including, but not limited to, a glass polyol-based compound, a reducing sugar-based compound, and combinations thereof, a hydroxyl end group of the compound being substituted by a trialkoxysilylalkyl group. By way of example, the reactive porogen may include, but is not limited to, a compound selected from a group including a glass polyol-based compound such as cyclodextrin, glucose, pentaerythritol, dipentaerythritol, and tripentaerythritol, a reducing sugar-based compound such as erythritol, (meso)erythritol, xylitol, and (D)manitol, and combinations thereof, a hydroxyl end group of the compound being substituted by a trialkoxysilylalkyl group (for example, a trimethoxysilylpropyl group or a triethoxysilylpropyl group), or combinations thereof. By way of example, when a reactive porogen is prepared by using the xylitol, in order to minimize phase separation with respect to a matrix, a material (TMSXT) all end groups of which are substituted by trimethoxysilyl xylitol (Si—(OCH$_3$)$_3$) groups through a two-step reaction including allylation and hydrosilylation may be used to allow a chemical bond between two phases.

If an ultra-low dielectric thin film is prepared by using the reactive porogen, a Q structure is formed by carrying out a sol-gel reaction with a matrix and a curing process and a nanoporous ultra-low dielectric material having a high mechanical strength can be prepared. The porogen as one of pore generating resins minimizes a decrease in mechanical strength depending on a pore content by adjusting miscibility with respect to a matrix and forms open pores through a phase separation with respect to the matrix at the same time. Therefore, an end group of a monosaccharide or a polysaccharide is modified and involved in a curing process of the matrix, so that an ultra-low dielectric material having closed pores of uniform size can be prepared.

A precursor solution of the organic silicate matrix and a precursor solution of the reactive porogen may be mixed to prepare a mixture thereof to form an ultra-low dielectric. In this case, the mixture may contain the reactive porogen-containing solution of about 60 volume % or less, for example, from about 20 volume % to about 60 volume %, with respect to the organic silicate matrix-containing solution.

The prepared mixture is coated on a substrate to form a thin film (S200).

The mixture may be coated in various ways and desirably, by spin coating. The spin coating allows formation of a large-area thin film and introduction of several-nm-size pores into the thin film, and thus, it is possible to easily reduce a dielectric constant. If the spin coating is performed, the formation of a thin film can be carried out at a high speed and at a low process cost, but the introduction of pores into the thin film may result in a decrease in other properties, such as a mechanical property and electric reliability, of the thin film. Therefore, in addition to the spin coating, another process needs to be performed to the nanoporous ultra-low dielectric thin film prepared to maintain a low dielectric constant and a high mechanical strength.

The thin film formed on the substrate is heat-treated, and the heat treatment includes an ozone treatment at a high temperature (S300).

The heat treatment may include a curing process. Therefore, the ozone treatment may be performed during the curing process of the heat treatment.

The ozone treatment is helpful to effectively remove the porogen at a relatively low temperature and improve a mechanical strength of the thin film and smoothness of a surface of the thin film by uniformizing pores within the thin film. Further, a hydroxyl group generated by the ozone treatment induces a sol-gel reaction in the matrix so as to improve a mechanical strength and reactivity between the porogen and the matrix.

The high-temperature ozone treatment performed at various temperatures affects the matrix and the porogen so as to substitute an alkoxy group and an alkyl group with a Si—OH group. The Si—OH group can increase a Si—O—Si bond through a sol-gel reaction, and can improve a mechanical strength. The ultra-low dielectric thin film is silicon-oxidized (SiO$_2$) by the ozone-treatment at a temperature of about 250° C. or more, and a refractive index and a dielectric constant thereof can be increased by a remaining —OH group.

The reactivity between the matrix and the porogen can be maximized and a dielectric property and a mechanical strength of the thin film can be optimum by the ozone treatment at a temperature of about 100° C. or more, for example, but not limited to, from about 100° C. to about 250° C., from about 100° C. to about 200° C., or from about 100° C. to about 150° C., or from about 100° C. to about 130° C. The optimum temperature of the ozone treatment can be changed depending on the organic silicate matrix and reactive porogen to be used.

The curing process of the heat treatment can be performed by heating the thin film formed on the substrate at a specific temperature and includes a multi-step temperature controlling process. Therefore, the heat treatment may include, but is not limited to, a first curing process to remove a solvent and to induce a condensation reaction of the organic silicate matrix, a second curing process performed at a temperature higher than the first curing process to introduce a nanopore and to increase a curing density, and a final heat treatment performed at a temperature higher than the second curing process. In order to cure the spin-coated thin film, various curing methods known in the art may be employed. By way of example, a temperature for the first curing process may be about 200° C. or more or about 250° C. or more, a temperature for the second curing process may be about 250° C. or more or about 300° C. or more, and a temperature for the heat treatment may be about 400° C. or more. The temperatures for the curing processes and the heat treatment may be selected appropriately by those skilled in the art depending on properties of the materials. Each process time for the curing processes and the heat treatment may be selected appropriately by those skilled in the art depending on properties of the materials.

A nanoporous ultra-low dielectric thin film can be prepared by the above-described method.

The prepared nanoporous ultra-low dielectric thin may have, for example, a dielectric constant of about 2.3 or less, an elastic modulus of about 10 GPa or more, and a hardness of about 1.2 GPa or more. By optimizing a temperature and a time for the ozone treatment, a nanoporous ultra-low dielectric thin having, for example, a dielectric constant of from about 2.2 to about 2.3, an elastic modulus of from about 10 GPa to about 15 GPa, and a hardness of from about 1.2 GPa to about 1.8 GPa can be prepared.

Hereinafter, an example of the present invention will be provided for easy understanding. The following example is just provided for better understanding, but the present invention is not limited thereto.

Example 1

Preparation Example 1. Synthesis of an Organic Silicate Matrix

A copolymer copolymerizing methyltrimethoxysilane (MTMS) at a molar ratio of about 75% and bis(triethoxysilyl)ethane (BTESE) at a molar ratio of about 25% as a matrix of a porous ultra-low dielectric thin film was synthesized according to the following Reaction Formula I and used. In the synthesis, HCl and water were used as catalysts and THF was used as a solvent. Further, $r_1$ (HCl mol/total monomer mol) was set to about 0.03 and $r_2$ (H$_2$O mol/total monomer mol) was set to about 10.0. After the reaction, the catalysts were removed by extraction. After the solvent was removed, the copolymer in a white solid state was obtained.

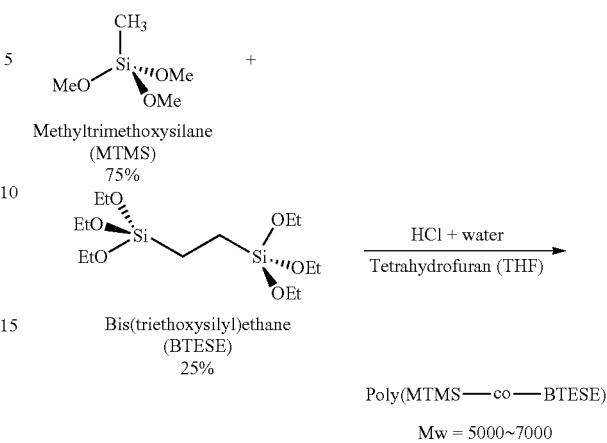

[Reaction Formula 1]

Methyltrimethoxysilane (MTMS) 75%

Bis(triethoxysilyl)ethane (BTESE) 25%

Poly(MTMS—co—BTESE)

Mw = 5000~7000

By copolymerizing the BTESE in which two Si atoms are bonded by an ethylene bridge, a tri-functional silane, such as the MTMS, that easily forms a cage structure had a reactive cage structure in which a network can be formed. As a result, by suppressing formation of an isolated cage structure or a perfect cage structure, the matrix having an excellent mechanical property was synthesized. The copolymer containing the BTESE of about 25 mole % had a dielectric constant of about 2.9 slightly higher than polymethylsilsesquioxane (MSSQ) (k=about 2.7) as a homopolymer of the MTMS and had a very high elastic modulus of about 11 GPa or more (MSSQ=about 3 GPa to about 5 GPa). Further, the copolymer had a lot of hydrophilic —OH groups at its ends. Thus, a sol-gel condensation reaction was easily made between the copolymer and the pore generating resin used in the present invention.

Preparation Example 2. Synthesis of a Reactive Porogen

Trimethoxysilyl xylitol (TMSXT) all end groups of which are substituted by trimethoxysilyl [Si—(OCH$_3$)$_3$] groups through an allylation and a hydrosilylation reaction with xylitol as a reducing sugar-based material was used as a reactive porogen. The substituted end groups allowed a chemical bond between a matrix prepared as described in the Preparation Example 1 and a porogen so as to minimize phase separation. It was found that when an ultra-low dielectric thin film was prepared by using the TMSXT, the thin film had excellent properties (k=about 2.12, E=about 9.1 GPa).

A method for preparing the TMSXT was performed as follows.

After xylitol of about 44 mol was dissolved in a NaOH aqueous solution of about 100 ml (about 33 volume %), tetrabutylammonium bromide (TBAB) of about 12.4 mol as a surfactant was dissolved therein. Then, while dropwisely adding allylbromide matched with an equivalent at regular intervals at a temperature of about 40° C., an allylation reaction was made for about 24 hours, and extra allylbromide was removed so as to prepare an allyl group-containing material. Trimethoxysilane matched with an equivalent was dissolved in the prepared material, and a platinum oxide as a catalyst was added thereto to make a hydrosilylation reaction at about 90° C. Then, by removing the solvent and the catalyst, a reactive porogen containing a trimethoxy silyl group was prepared. A synthesis result of the prepared reactive porogen could be confirmed from a $^1$H-NMR spectrum. A Reaction Formula of the above-described preparing method was as follows.

[Reaction Formula 2]

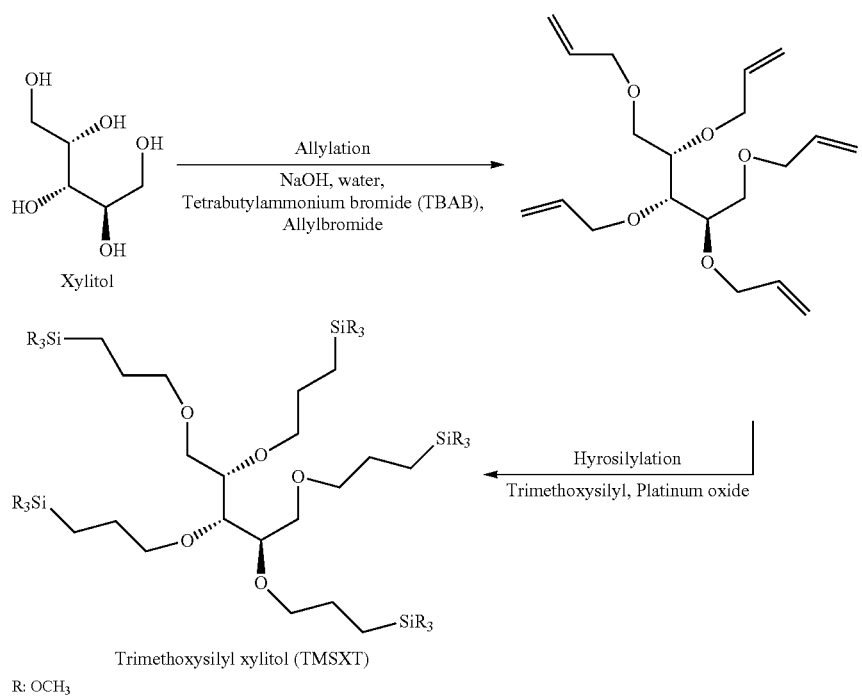

Trimethoxysilyl xylitol (TMSXT)
R: OCH$_3$

Example 1. Preparation of a Nanoporous Ultra-Low Dielectric Thin Film Ozone-Treated at High Temperature and Analysis of Property Thereof 1. Preparation of a Nanoporous Ultra-Low Dielectric Thin Film Ozone-Treated at High Temperature A method of preparing a nanoporous ultra-low dielectric thin film by using the copolymer containing BTESE of about 25 mole % as a matrix prepared as described in the Preparation Example 1 and MSXT porogen prepared as described in the Preparation Example 2 was performed as follows.

After a solution of about 20 weight % was prepared as the matrix by using 1-methoxy-2-propanol acetate (PMA) solvent, a porogen solution of the same weight % was prepared to prepare a mixture containing the porogen solution of about 0 volume %, about 20 volume %, about 40 volume %, and about 60 volume % with respect to the matrix solution. The mixture was spin-coated on a substrate to prepare a thin film. The spin coating was performed at a rotation speed of about 2500 rpm and for about 30 seconds. A heat treatment including a curing process to be described below was performed onto the prepared thin film.

<Heat Treatment>

The prepared thin film was heated to about 250° C. at a speed of about 3° C./min. Then, a curing process was performed at about 250° C. for about 2 hours so as to remove the solvent and to induce a condensation reaction of the matrix. Subsequently, the thin film was heated to about 300° C. at the same speed and a curing process was performed at about 300° C. for about 2 hours so as to introduce a nanopore and to increase a curing density of the matrix through a reaction between the matrix and the porogen and a spontaneous chemical rearrangement of the porogen. Thereafter, the thin film was heated to about 430° C. and a heat treatment was performed at about 430° C. for about 1 hour so as to prepare a nanoporous ultra-low dielectric thin film.

During the heat treatment, an ozone treatment was performed at each temperature of about 110° C., about 130° C., about 150° C., about 250° C., and about 430° C. for about 1 minute, about 2 minutes, and about 10 minutes. During the ozone treatment, a flow rate of ozone was about 5 LPM, and a concentration of ozone was set to about 100%.

2. Analysis of Property of the Nanoporous Ultra-Low Dielectric Thin Film Ozone-Treated at High Temperature (1) Refractive Index (n) and Porous Ratio (P)

A refractive index (R.I.) of the nanoporous ultra-low dielectric thin film was measured by using a Filmetrics (F-20, Filmetrics, Inc.) with a light source having a wavelength of about 632.8 nm, and an average value of the refractive index was obtained by scanning 20 or more spots per sample. A porous ratio (P) was calculated based on the refractive index by using the following Lorentz-Lorenz formula.

$$\frac{n_0^2 - 1}{n_0^2 + 2}(1 - p) = \frac{n^2 - 1}{n^2 + 2}$$

$n_o$: a refractive index of a matrix film
n: a refractive index of a porous film
P: a porous ratio (2) Dielectric Constant A theoretical dielectric constant (expected k) in an optical frequency was calculated based on the porous ratio obtained from the refractive index by using the following Maxwell-Garnett's formula.

$$\frac{k_0 - 1}{k_0 + 1}(1 - p) = \frac{k - 1}{k + 1}$$

$k_o$: a dielectric constant of a matrix film
k: a dielectric constant of a porous film
P: a porous ratio A metal-insulator-semiconductor (MIS) device was prepared to measure an actual dielectric constant of a nanoporous thin film. In the MIS device, a highly doped Si-wafer as a lower electrode was spin-coated with an ultra-low dielectric material to form a thin film. Nine (9) aluminum dots each having a diameter of about 1 mm were vacuum-deposited on a cured ultra-low dielectric thin film so as to be used as an electrode, and indium (In) was bonded onto the wafer so as to be used as an electrode. For an ohmic contact at an interface between the wafer and the In, a conductive paint P-100 (silver paste) was used to bond them. Lastly, a dielectric constant of the MIS device was measured at a frequency of about 1 MHz at room temperature by using a LCR meter (Agilent, 4284A).

(3) Mechanical Strength

An elastic modulus (E) and a surface hardness (H) of the prepared nanoporous thin film were measured through a nanoindentation (MTS XP, MTS System Corp.) experiment. The nanoindentation experiment was a method for measuring an elastic modulus and a hardness of a thin film by pressing a sharp indenter with a very small load to be modified to a depth of about 1 μm or less, and this experiment was one of most useful methods for measuring mechanical properties of a thin film. Further, with a continuous stiffness measurement function, vibration was added to an indentation depth control process so as to measure continuous properties of a thin film material from a beginning of the indentation to a maximum indentation depth. An amplitude was set to be so low (about 1 nm or about 0.3 μN) not to affect an original indentation process. A measurement result distribution depending on an indentation depth was increased or decreased due to properties of a substrate material. When a property was affected by an under layer of the thin film and changed depending on an indentation depth, an area having a uniform property despite a change in an indentation depth was measured and the measured value was selected as a unique property of the thin film.

(4) Solid-State NMR/FT-IR

In order to analyze an effect of a temperature of an ozone treatment on a molecular structure of a matrix and a porogen, a solid-state NMR (unity INOVA, Varinan) and a FT-IR (Nicolet, Thermo Fisher Scientific) were used. In particular, a change in a molecular structure of a matrix and a porogen synthesized on the basis of a silicon atom was analyzed with a $^{29}$Si-NMR. A structure of a silicon compound was classified by a kind of an atom around a silicon atom, and $SiC_xO_{4-x}$ on the basis of a silicon atom had Q″, T″, D″, and M″ structures depending on x (x=0, 1, 2, 3, 4). In addition to the $^{29}$Si-NMR, a $^{13}$C-NMR and a $^1$H-NMR were used to analyze a molecular structure with more accuracy.

An effect of ozone depending on a temperature were analyzed with a FT-IR and a change in an area of a Si—O—Si peak in a wave number range of from about 950 $cm^{-1}$ to about 1250 $cm^{-1}$ were analyzed so as to analyze improvement in mechanical strength caused by an ozone treatment. The FT-IR had accuracy lower than the solid-state NMR, but was capable of measuring properties of a thin film with the FT-IR, and, thus, it was possible to easily check a change in a molecular structure.

Depending on a substituted atom and a three-dimensional structure, a Si—O—Si bonding structure was classified into three structures: a suboxide structure; a network structure; and a cage structure. The cage structure had a low mechanical strength and a low refractive index due to its structural property. Meanwhile, the suboxide structure and the network structure had a high refractive index and a high mechanical property due to their relatively dense molecular structure. A FT-IR spectrum was deconvoluted with three peaks of the respective structures, and improvement in mechanical strength was analyzed by reference to a change in each area.

(5) C/Si Content in Thin Film

A quantitative analysis of a carbon atom and a silicon atom in a thin film was carried out by means of X-ray photoelectron spectroscopy. When a photon (X-ray) having specific energy was irradiated to a sample, photoelectrons were released from the sample. It was possible to obtain binding energy required to release the photoelectrons from the sample by measuring kinetic energy of these photoelectrons. This binding energy was a unique property of an atom, and, thus, it was possible to carry out an elementary analysis and measurement of a surface concentration of an element by reference to such property. A C/Si content was calculated based on the amounts of the carbon and silicon atoms quantitatively analyzed.

3. Result of Property Analysis (1) Ozone Treatment Effect with Variation of Temperature <FT-IR Analysis>

Figure 3A:
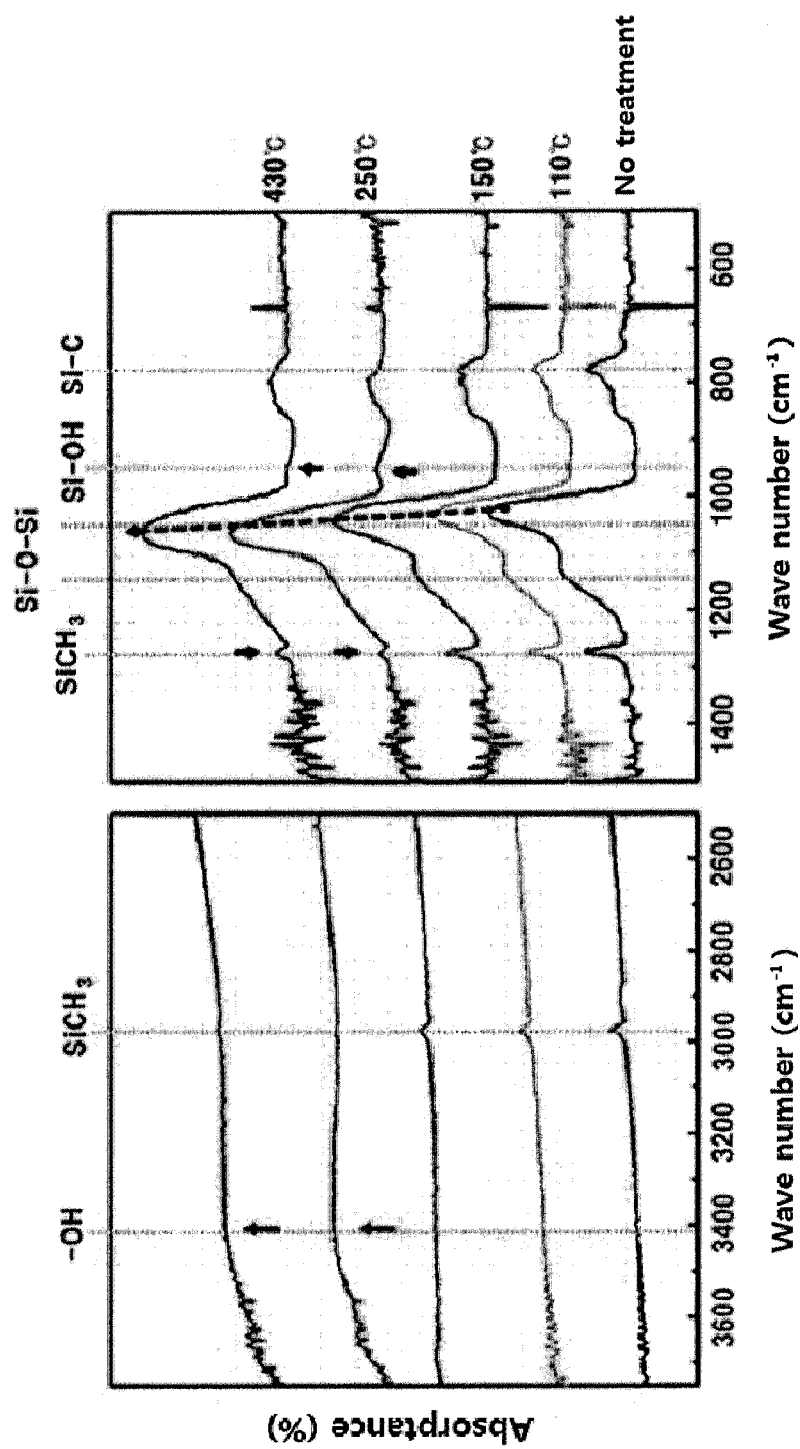
FIG. 3 provides graphs each showing results of a FT-IR analysis (a) and a deconvolution analysis (b) of an ultra-low dielectric thin film in accordance with an example of the present invention.

In order to check an ozone treatment effect with variation of temperature, the prepared nanoporous low dielectric thin film was ozone-treated at each temperature of about 110° C., about 130° C., about 150° C., about 250° C., and about 430° C. for about 10 minutes. FIG. 3a shows a result of a FT-IR analysis on the low dielectric thin film to which an ozone treatment was performed at each temperature and a series of curing processes ware performed. The low dielectric thin film ozone-treated at about 250° C. and at about 430° C. generated an —OH group as a result of a reaction with ozone and showed an —OH peak in a wide range of from about 3700 $cm^{-1}$ to about 3200 $cm^{-1}$ and a Si—OH peak in a range of from about 955 $cm^1$ to about 830 $cm^1$. The —OH group was generated since Si—$CH_3$ was substituted by Si—OH during the reaction with ozone. It could be seen from a decrease in a $CH_3$ peak at about 1273 $cm^{-1}$. Further, it was found that a Si—C peak (from about 890 $cm^{-1}$ to about 740 $cm^{-1}$) and a Si—$CH_3$ peak (about 2950 $cm^{-1}$) disappeared or waned as a temperature increased.

Figure 3B:
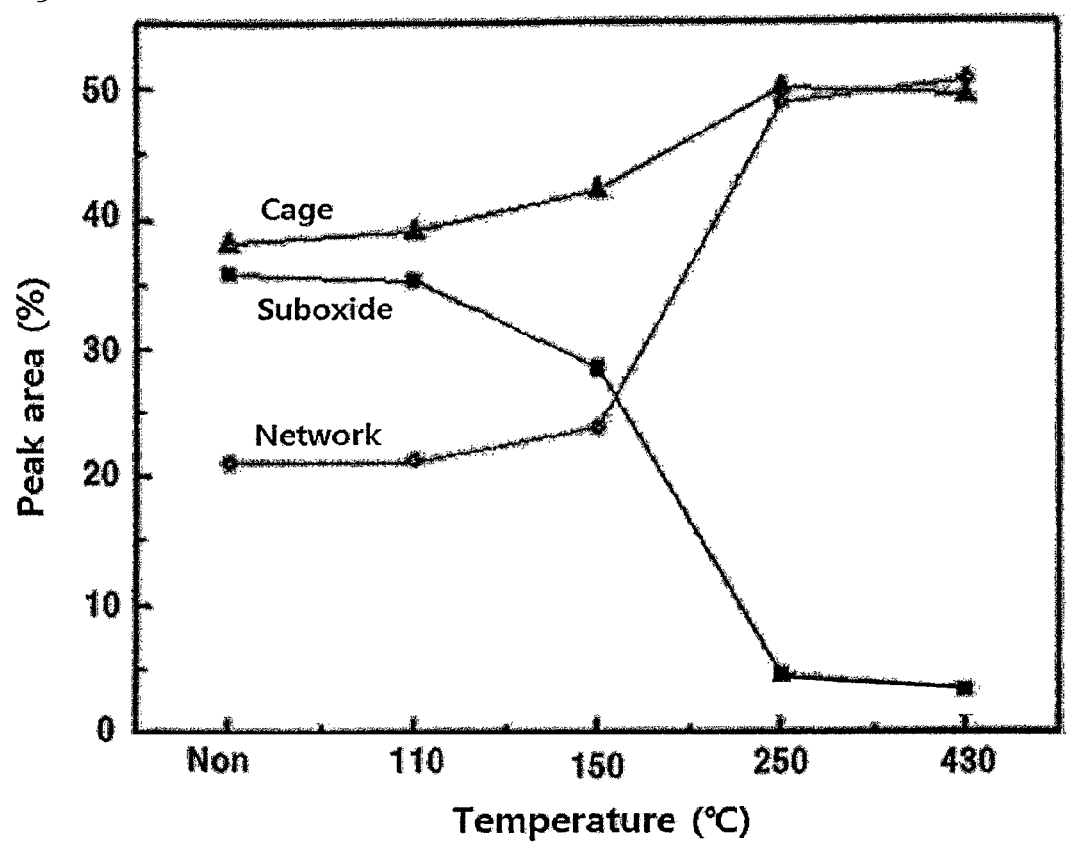

From a change in a Si—O—Si peak shown in a range of from about 1250 $cm^{-1}$ to about 950 $cm^{-1}$, it could be seen that the top of the peak was moved as a temperature increased. This was because a suboxide peak shown at 1023 $cm^{-1}$ waned and a network structure relatively increased due to a decrease in Si—$CH_3$. FIG. 3b shows a result of a deconvolution analysis on a Si—O—Si peak and a Si—$CH_3$ shown in a range of from about 950 $cm^{-1}$ to about 1280 $cm^{-1}$. An area of a suboxide structure decreased and areas of a cage structure and a network structure relatively increased. Therefore, it was found that a thin film was silicon-oxidized ($SiO_2$) by an ozone treatment at a temperature of about 250° C. or more.

<Remaining —OH Group>

Figure 4A:
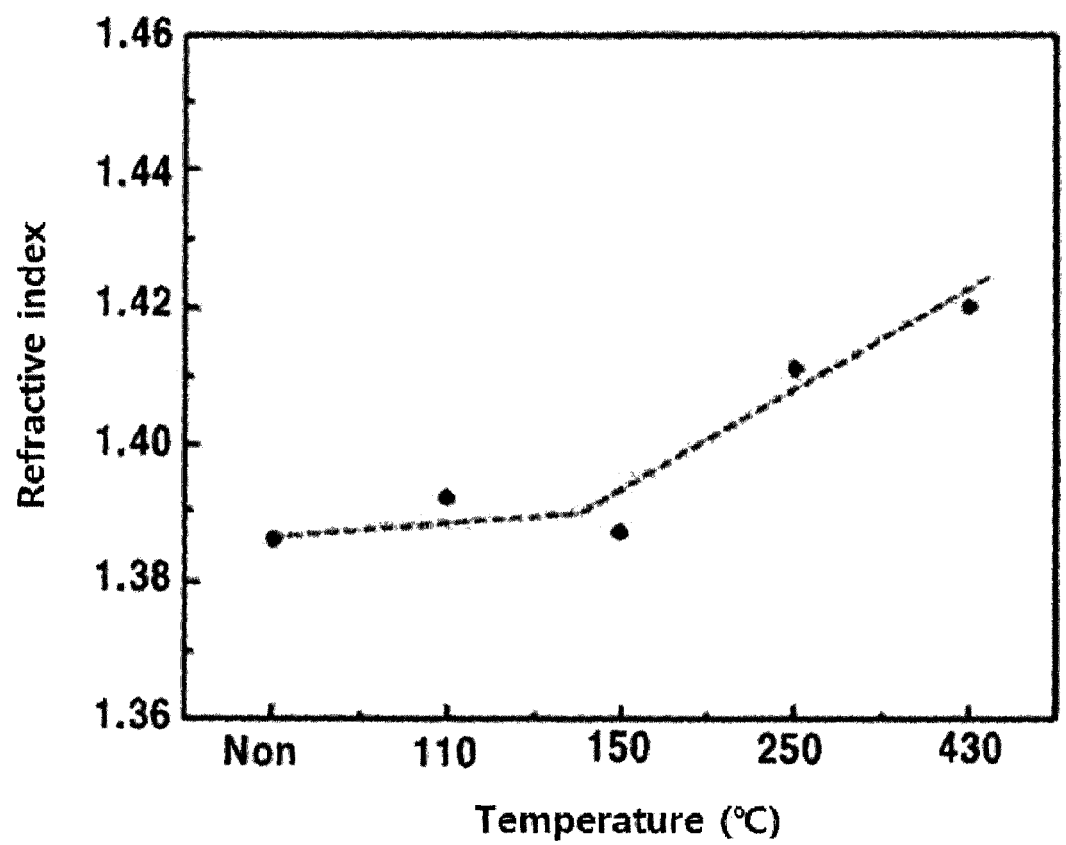
FIG. 4 provides graphs showing results of a refractive index analysis (a) and a FT-IR analysis (b) of an ultra-low dielectric thin film in accordance with an example of the present invention.

As described above, it was found that when an ozone treatment was carried out at a high temperature of about 250° C. or more, reactivity of ozone increased and a Si—$CH_3$ group was affected accordingly and changed into a Si—OH group. However, a remaining —OH group after a heat treatment shown in a FT-IR spectrum (FIG. 3a) became a cause of an increase in refractive index of a thin film. FIG. 4a shows a refractive index of a low dielectric thin film ozone-treated at each temperature. It could be seen from FIGS. 3a and 4a that a refractive index increased due to remaining —OH groups after a curing process. Typically, if an —OH group exists in an ultra-low dielectric thin film, a hydroscopic property of water becomes high, resulting in an increase in dielectric constant. Accordingly, by additionally performing a curing process onto a low dielectric thin film ozone-treated at about 430° C., a condensation reaction of an —OH group was induced.

Figure 4B:
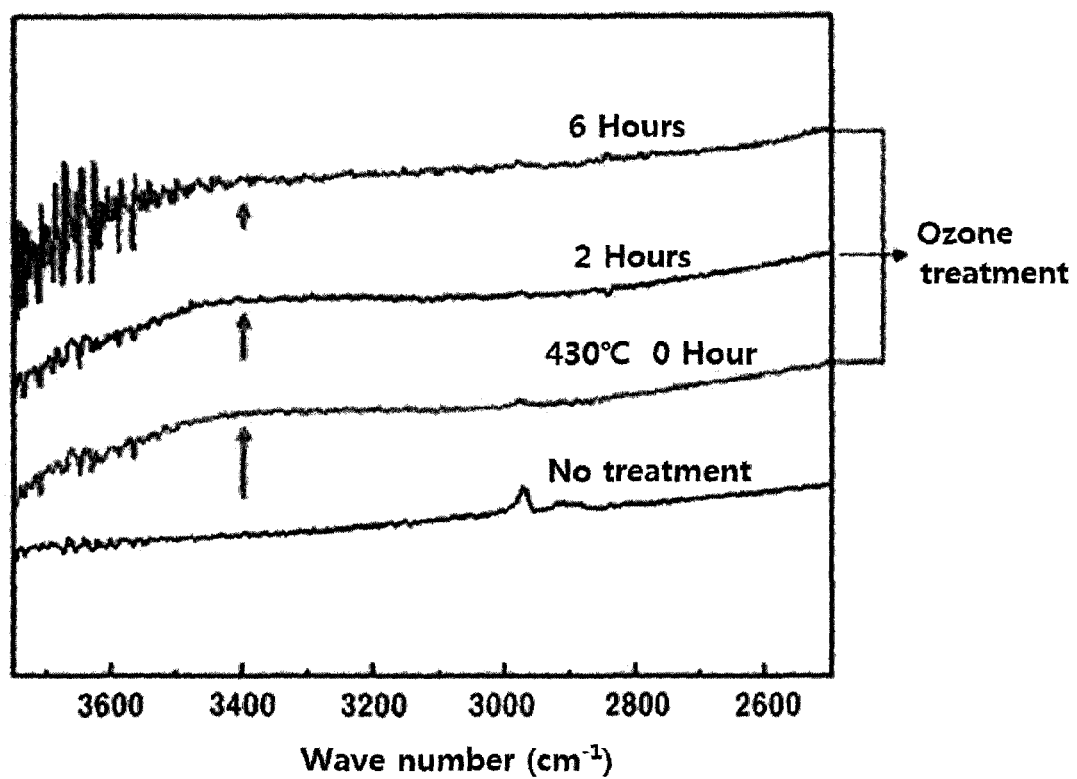

FIG. 4b shows a FT-IR spectrum of a low dielectric thin film which was ozone-treated at about 430° C. and additionally heat-treated at about 430° C. for about 2 hours and about 6 hours respectively. Although an —OH peak was slightly decreased due to the additional heat treatment, an —OH group still remained within the thin film as compared with a peak of a thin film which was not ozone-treated. This was because if the thin film was ozone-treated at about 430° C., Si—$CH_3$ groups of a cured matrix were substituted by Si—OH groups and the substituted —OH groups could not make a condensation reaction within the rigid matrix and remained due to a steric hindrance.

As a result, the ozone treatment at a temperature of about 250° C. or more affected the Si—$CH_3$ of a matrix so as to form a porous $SiO_2$ thin film. However, a MSQ-based material used as a matrix in the present invention was a material having a dielectric constant of about 2.7 which was reduced by substituting either one reaction group of $SiO_2$ (k=about 4) with a methyl group. When the methyl group decreased during the ozone treatment, the dielectric constant increased. There is a problem that the non-reactive and remaining —OH groups could increase the dielectric constant.

(2) Optimization of Temperature for Ozone Treatment
<Ozone Treatment onto Matrix>

In order to find an optimum temperature for an ozone treatment, an ozone treatment was performed at a temperature of about 250° C. or less at which a Si—$CH_3$ of a matrix was not affected. A thin film prepared by spin-coating the matrix was ozone-treated at room temperature and about 150° C. respectively. In order to compare only an ozone effect depending on a temperature, a thin film which was not ozone-treated and a thin film which was ozone-treated at room temperature were baked to about 150° C.

Figure 5:
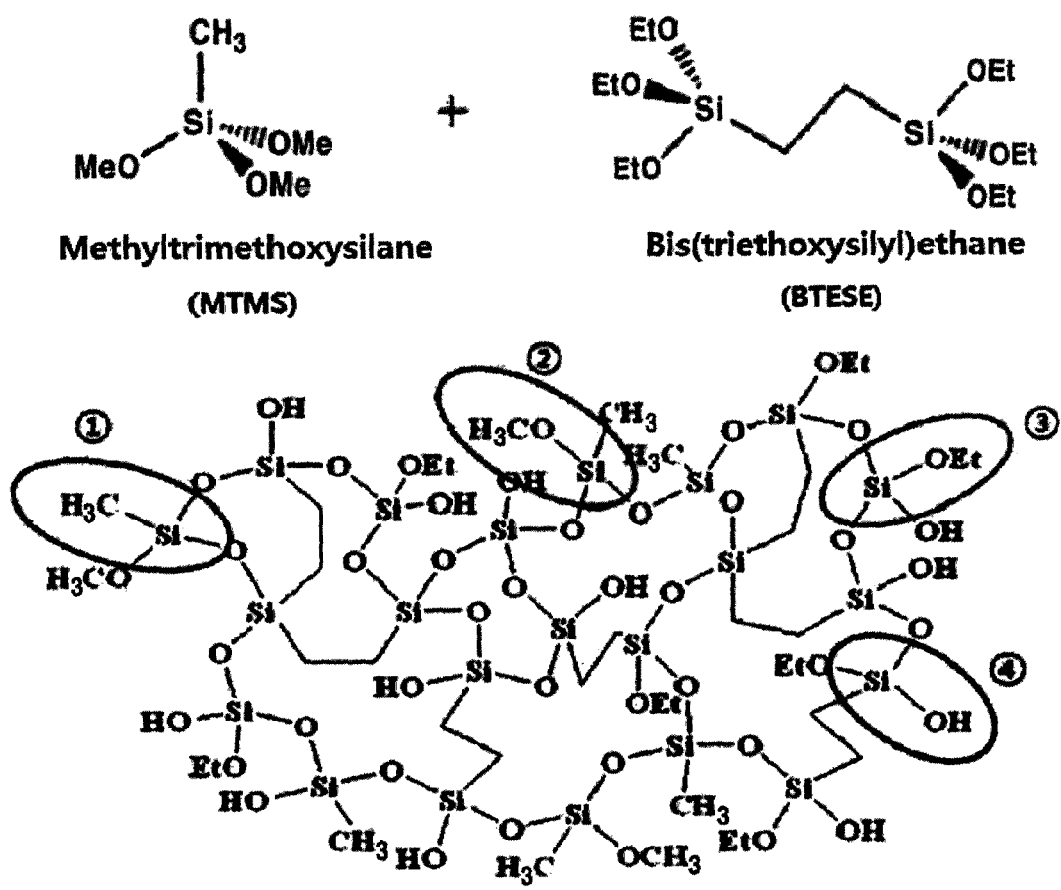
FIG. 5 provides chemical formulas each showing a structure of a poly(MTMS-co-BTESE) used as an organic silicate matrix in accordance with an example of the present invention.
Figure 6A:
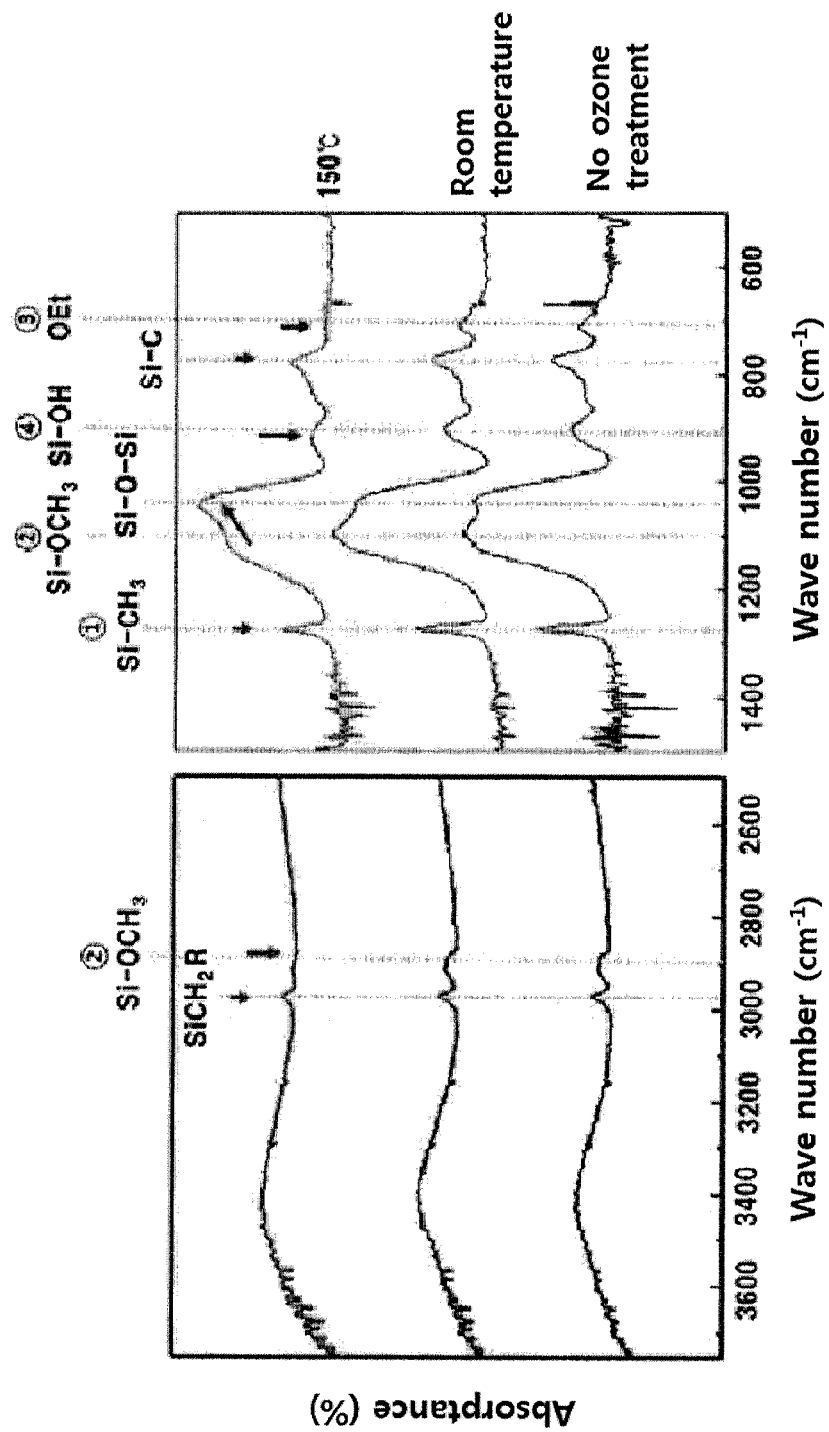
FIG. 6 provides graphs showing results of a FT-IR analysis (a) and a $^{29}$Si-NMR analysis (b) related to an ozone treatment of a matrix in accordance with an example of the present invention.

FIG. 5 shows a structure of a poly(MTMS-co-BTESE) used as a matrix. The structure had four ends including Si—$CH_3$ and Si—$OCH_3$ generated from MTMS, Si-OEt generated from BTESE, and Si—OH generated from a sol-gel reaction. A change in a structure of a thin film which was ozone-treated at room temperature and about 150° C. and a thin film which was not ozone-treated was examined by means of FT-IR (FIG. 6a). As a result, it could be seen that during the ozone treatment at about 150° C., Si—$OCH_3$ (from about 2955 $cm^{-1}$ to about 2925 $cm^{-1}$) and Si-OEt (from about 650 $cm^{-1}$ to about 750 $cm^{-1}$) peaks were decreased and a Si—OH (from about 955 $cm^{-1}$ to about 830 $cm^{-1}$) peak was decreased. This was because reactivity of ozone increased due to an increase in temperature and Si—$OCH_3$ and Si-OEt groups were changed into Si—OH groups and a condensation reaction was immediately carried out so as to form Si—O—Si structures. This could be seen that the top of a Si—O—Si peak was moved to a network structure (about 1063 $cm^{-1}$) during the ozone treatment at about 150° C.

Figure 6B:
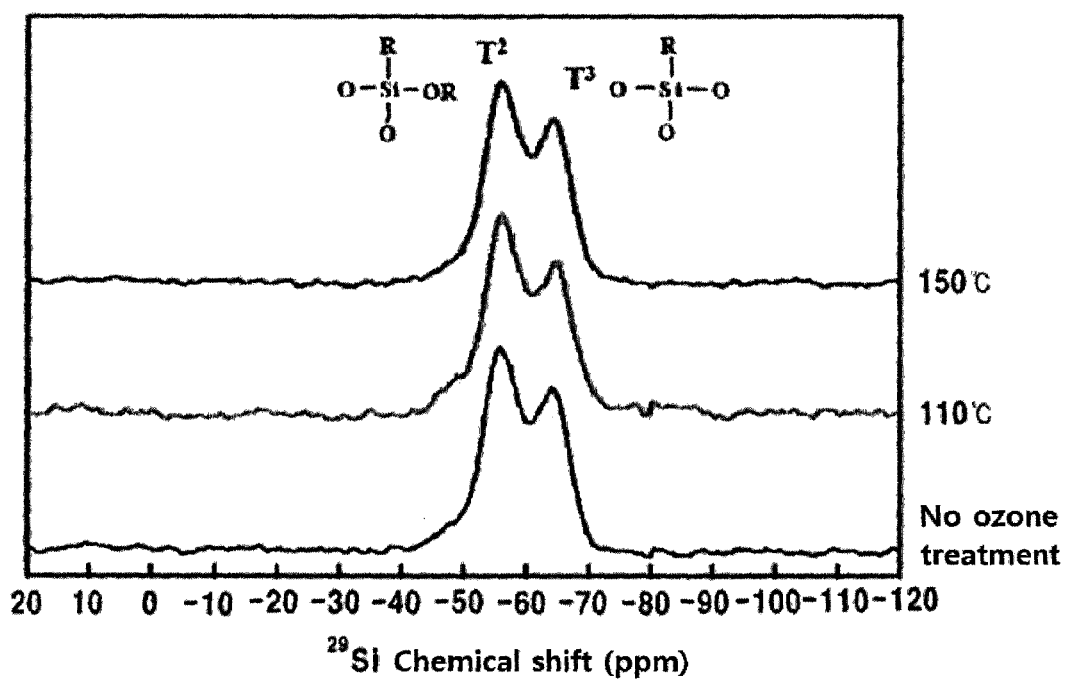

A Si—O—Si structure was formed by a reaction of a Si—OH group changed from a Si—$CH_3$ group of a matrix during an ozone treatment at about 250° C. or more, whereas a Si—O—Si structure was formed by a reaction of a Si—OH group changed from Si—$OCH_3$ and Si-OEt groups during an ozone treatment at about 150° C. or less. Referring to FIG. 6b, there was no change in a structure of Si and its surroundings during an ozone treatment at each temperature. If a Si—$CH_3$ group was changed into a Si—OH group by ozone, a Q peak would be shown on a $^{29}$Si-NMR. That is, no change on the $^{29}$Si-NMR meant that the Si—$CH_3$ group was not affected, and it could be seen from a change in a peak on a FT-IR that an —$OCH_3$ group was substituted by an —OH group.

<Ozone Treatment onto Porogen>

A pyrolysis temperature of a synthesized porogen was in a range of from about 200° C. to about 300° C., and thus, an ozone treatment at about 250° C. or less affected the porogen as well as the matrix. In order to find an effect on the porogen, after a spin-coating process with a porogen solution, an ozone treatment was performed at each temperature. In order to compare only an effect of ozone depending on a temperature, a prepared thin film was ozone-treated at each temperature and baked to about 150° C. in the same manner as the matrix.

Figure 7:
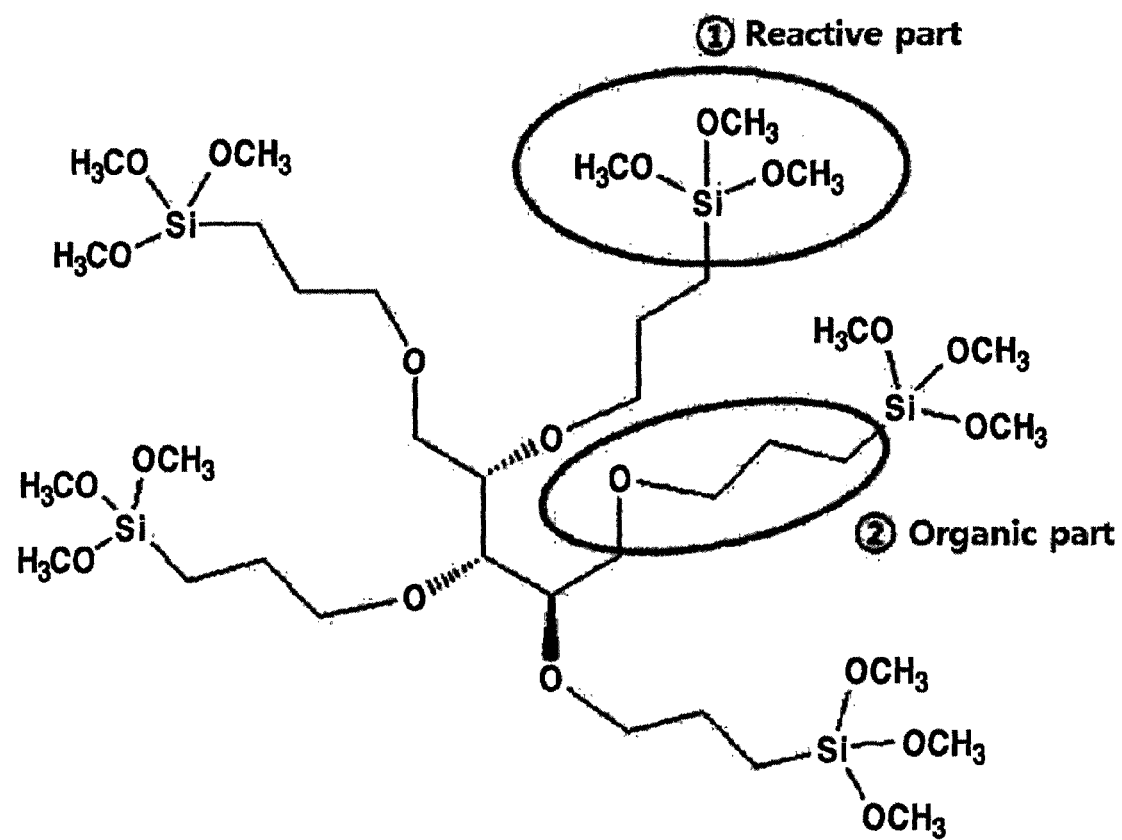
FIG. 7 is a chemical formula showing a structure of a trimethoxysilyl xylitol used as a reactive porogen in accordance with an example of the present invention.

FIG. 7 shows a structure of a synthesized reactive porogen including a part substituted with a trimethoxysilane group (reactive part) and a part connected to xylitol (organic part). The porogen introduced into the matrix was dispersed in the matrix due to Si—$OCH_3$ at its end and became nanohybridized. Thereafter, when an ozone treatment was performed during a curing process, the end of the porogen was substituted by a Si—OH group, resulting in an increase in miscibility with the matrix. However, when the part connected to the xylitol was affected first by ozone before the matrix was cured, the porogen was removed before a pore was generated. Therefore, a perfect pore could not be generated.

Figure 8A:
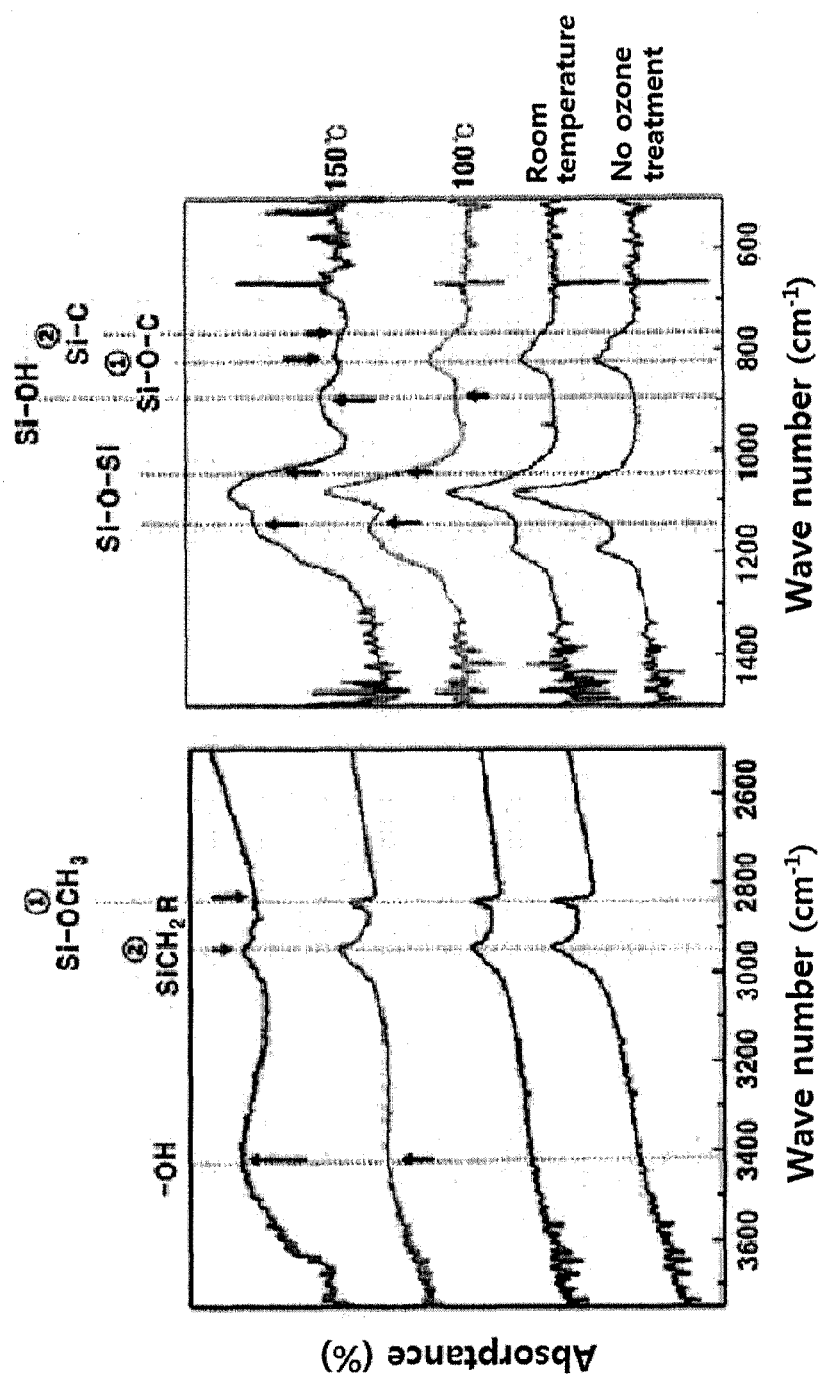
FIG. 8 provides graphs showing results of a FT-IR analysis (a) and a $^{29}$Si-NMR analysis (b) related to an ozone treatment of a porogen in accordance with an example of the present invention.
Figure 8B:
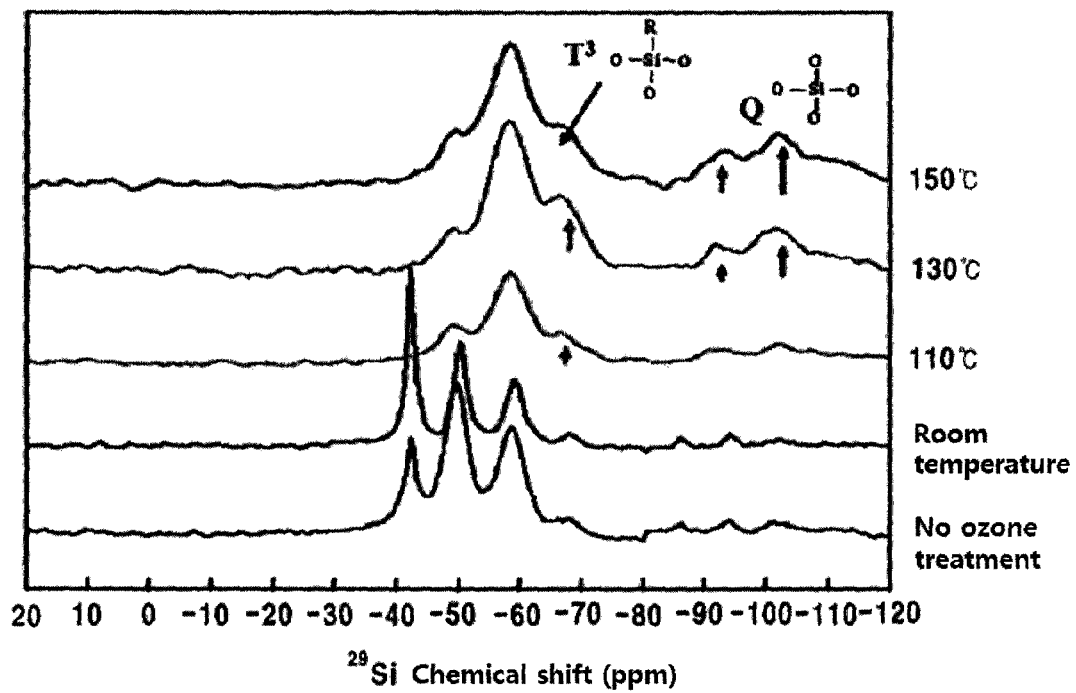

FIG. 8a shows a FT-IR analysis on a chemical and structural change due to ozone. As a result of an ozone treatment performed at room temperature, about 100° C., and about 150° C., an —OH peak (from about 3200 $cm^{-1}$ to about 3600 $cm^{-1}$) and a Si—OH peak (from about 830 $cm^{-1}$ to about 955 $cm^{-1}$) were shown and a Si—$OCH_3$ peak (from about 2880 $cm^{-1}$ to about 2815 $cm^{-1}$) disappeared at about 100° C. or more. Further, as the reaction proceeded, a Si—O—Si was formed. In order to accurately check a structural change, a change at an end was analyzed by using $^{29}$Si-NMR (FIG. 8b). As can be seen from a structure of FIG. 7, the end of the porogen had a T-structure, and three peaks of from $T^0$ to $T^2$ was shown in a range of from about −40 ppm to about −60 ppm according to the $^{29}$Si-NMR analysis. When an ozone treatment was performed at about 110° C. or more, an —OH group was generated and a reaction between porogens was made so as to form a $T^3$ structure. When an ozone treatment was performed at about 130° C. or more, a Q peak was generated. The generation of the Q peak meant that the part connected the end of the porogen and the xylitol was affected by ozone. Therefore, it was confirmed that when the ozone treatment was performed at about 110° C., only Si—$OCH_3$ at the end of the porogen was substituted by Si—OH, resulting in an increase in miscibility with the matrix.

(3) Property of Ultra-Low Dielectric Thin Film
<Refractive Index and Porous Ratio>

Figure 9A:
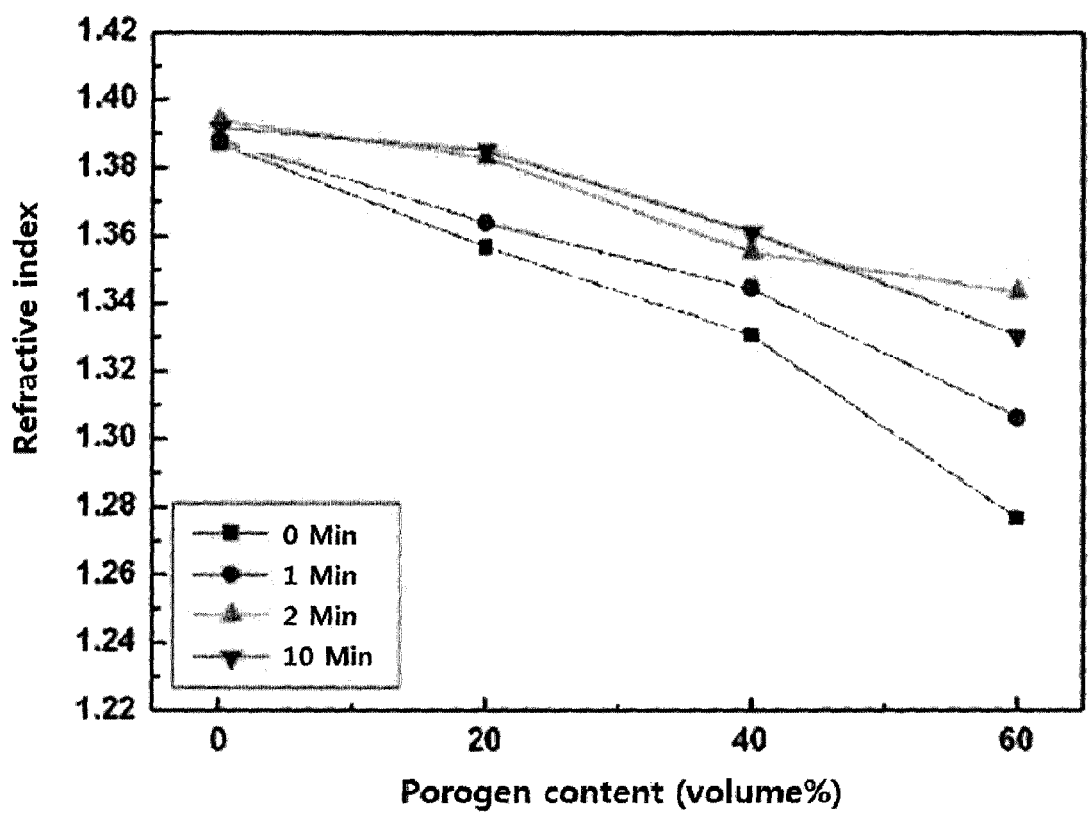
FIG. 9 provides graphs each showing a refractive index (a) and a porous ratio (b) depending on an ozone treatment time of an ultra-low dielectric thin film and a porogen content therein in accordance with an example of the present invention.
Figure 9B:
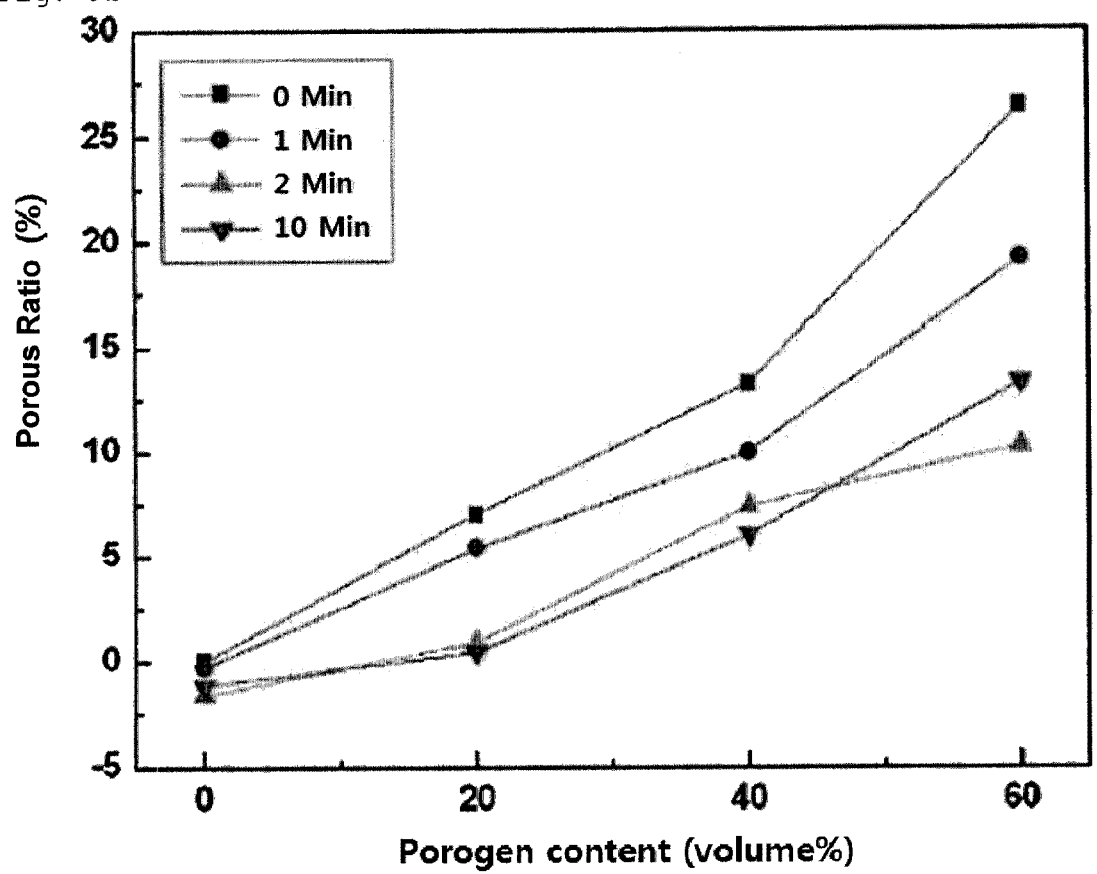

FIG. 9 shows a refractive index and a porous ratio of a nanoporous ultra-low dielectric thin film ozone-treated at about 110° C. for about 1 minute, about 2 minutes, and about 10 minutes. In case of an ozone treatment, an additional Si—O—Si structure was formed, resulting in a decrease in porous ratio and an increase in refractive index. Such a phenomenon was particularly noticeable as a porogen content was increased from about 0 volume % to about 20 volume %, about 40 volume %, and about 60 volume %. This was because as for a matrix, a porous ratio was decreased due to a Si—O—Si structure formed by an ozone treatment and a refractive index was decreased due to disappearance of a methoxy group (—OMe) and an ethoxy group (—OEt) in the matrix by the ozone treatment at the same time. Further, as a process time was increased, a refractive index was highly increased, but a great change did not occur in a process performed for about 2 minutes or more. That is, a change into a hydroxyl group was completed within about 2 minutes due to high reactivity of ozone.

<Mechanical Strength>

Figure 10A:
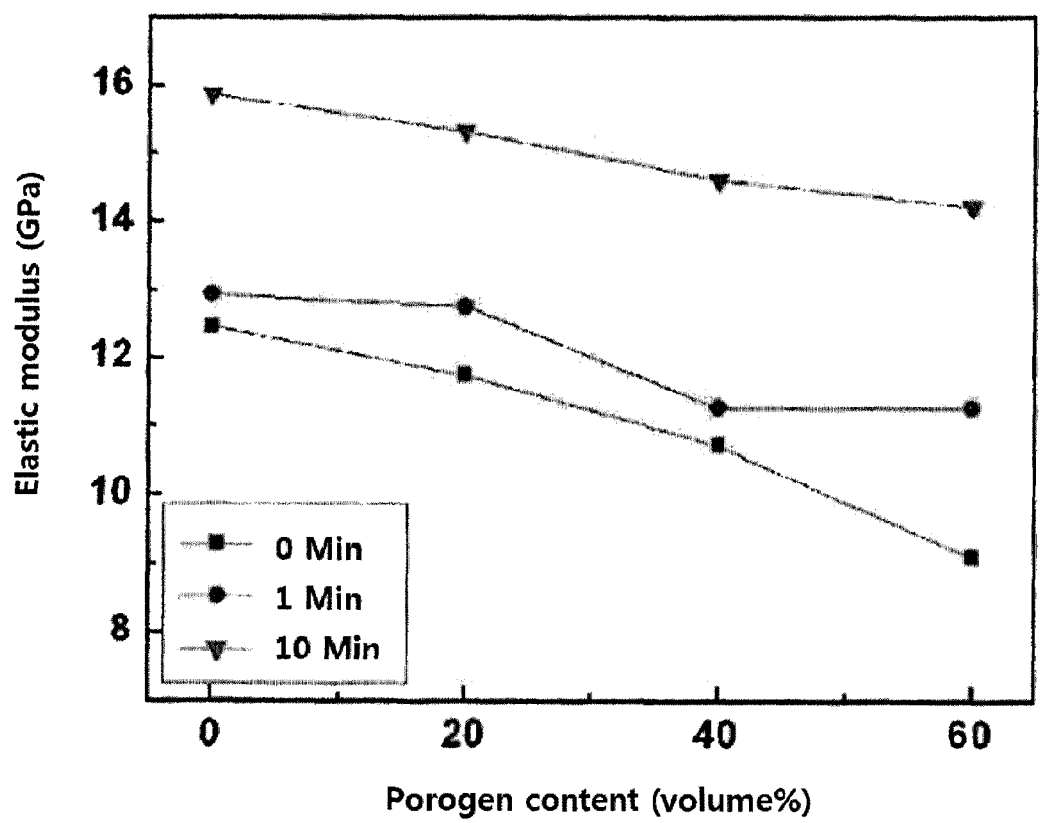
FIG. 10 provides graphs each showing an elastic modulus (a) and a hardness (b) depending on an ozone treatment time of an ultra-low dielectric thin film and a porogen content therein in accordance with an example of the present invention.
Figure 10B:
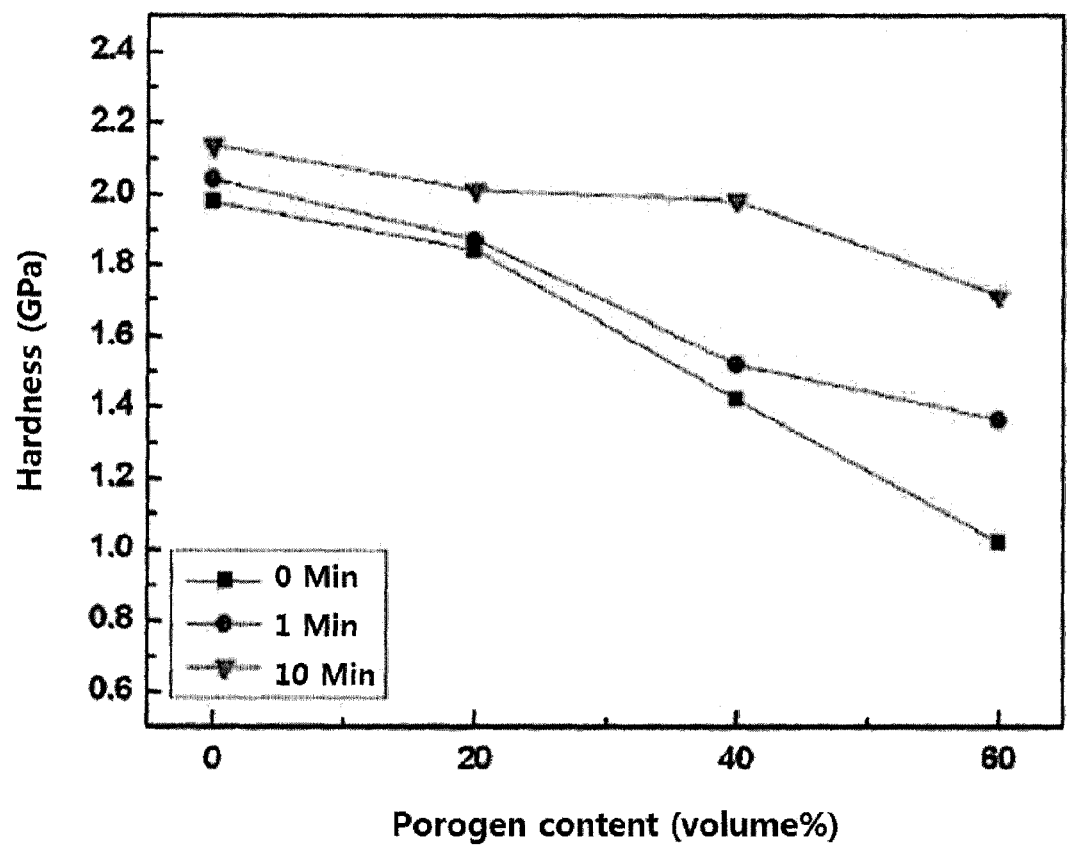
Figure 11A:
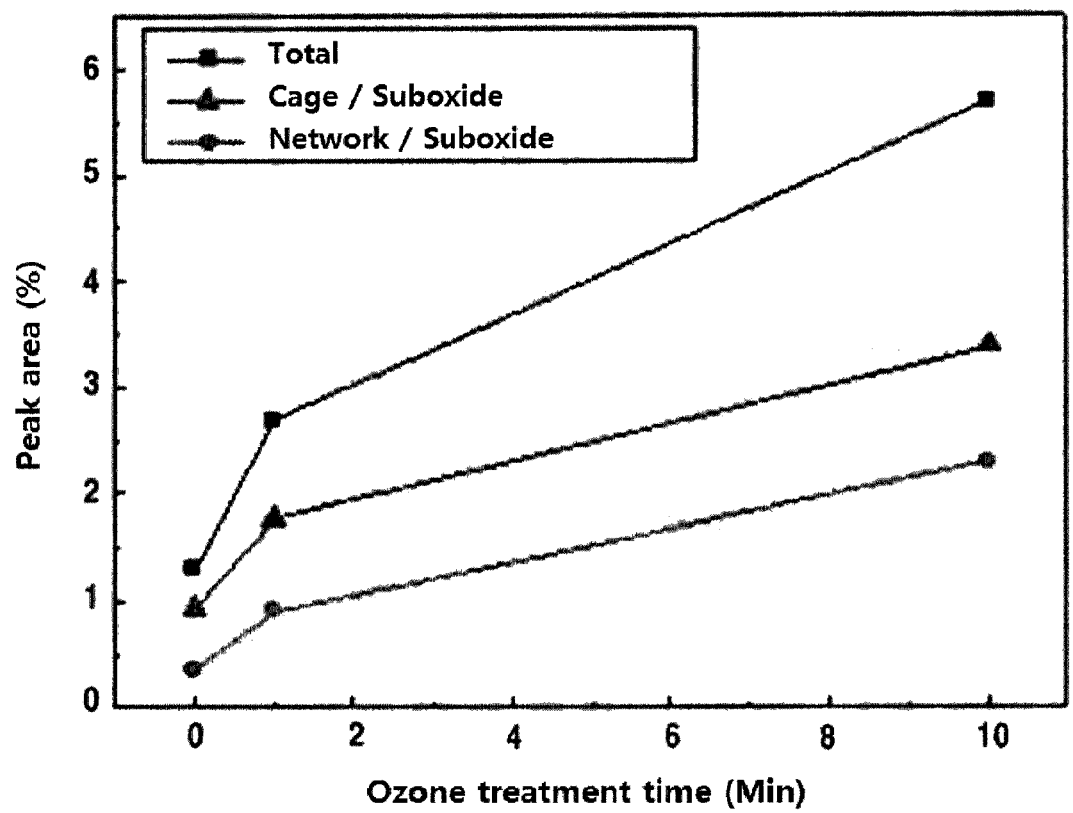
FIG. 11 provides graphs each showing a change in a Si—O—Si structure of an ultra-low dielectric thin film containing a matrix (a) or a porogen of about 20 volume %
Figure 11B:
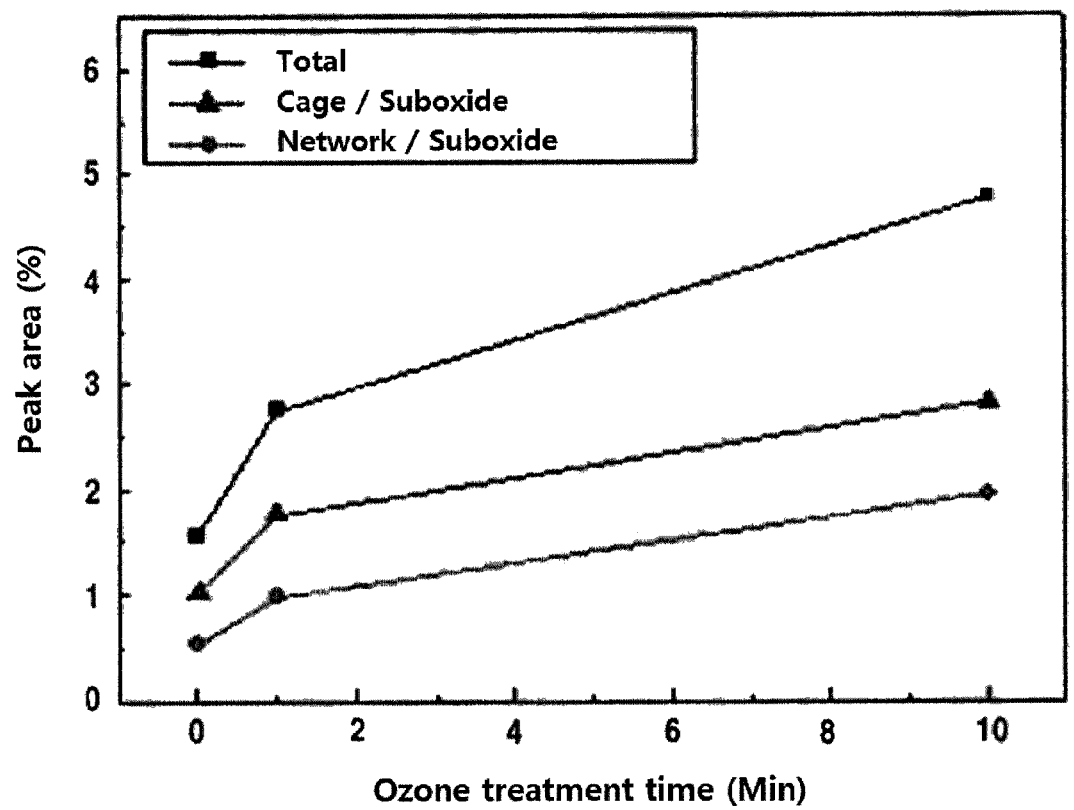
Figure 11C:
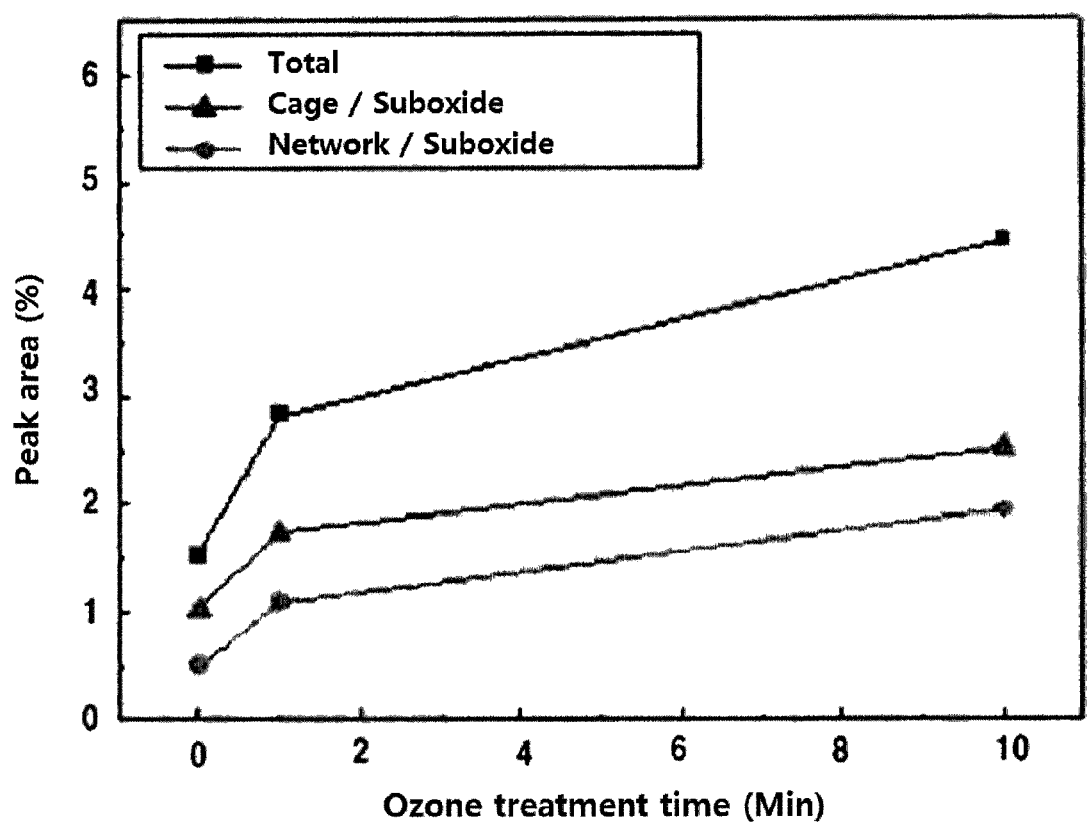
Figure 11D:
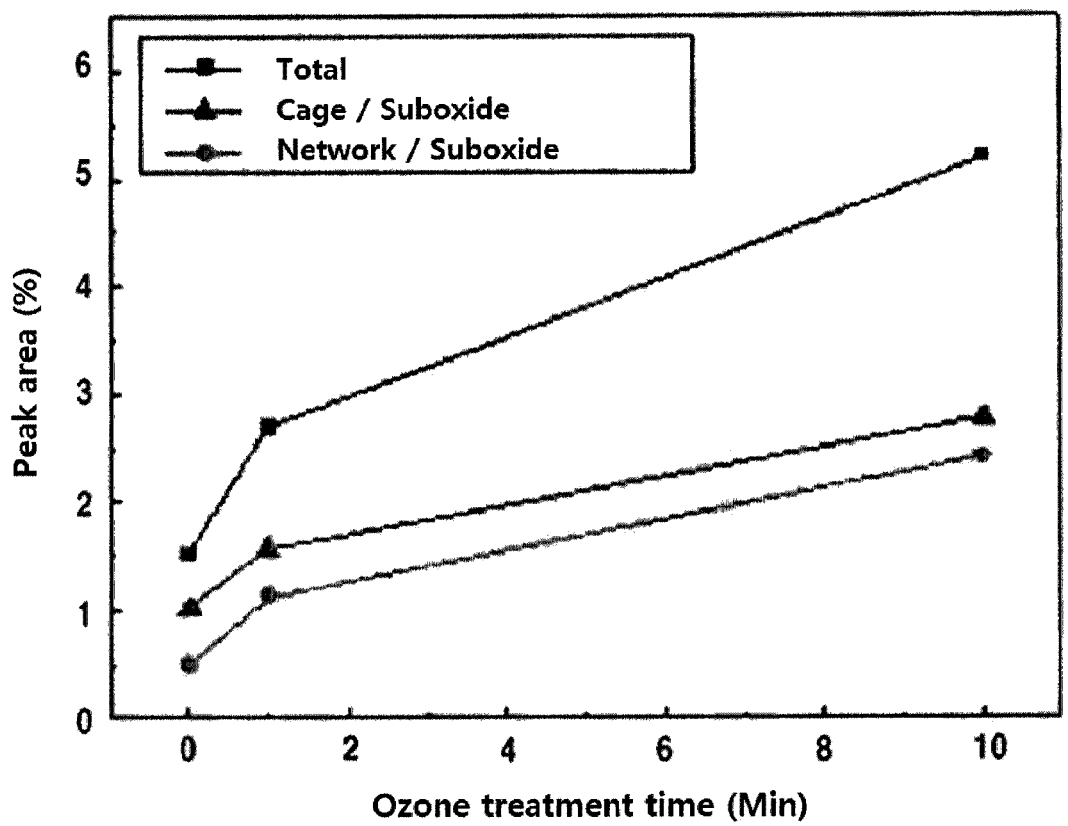
Figure 12A:
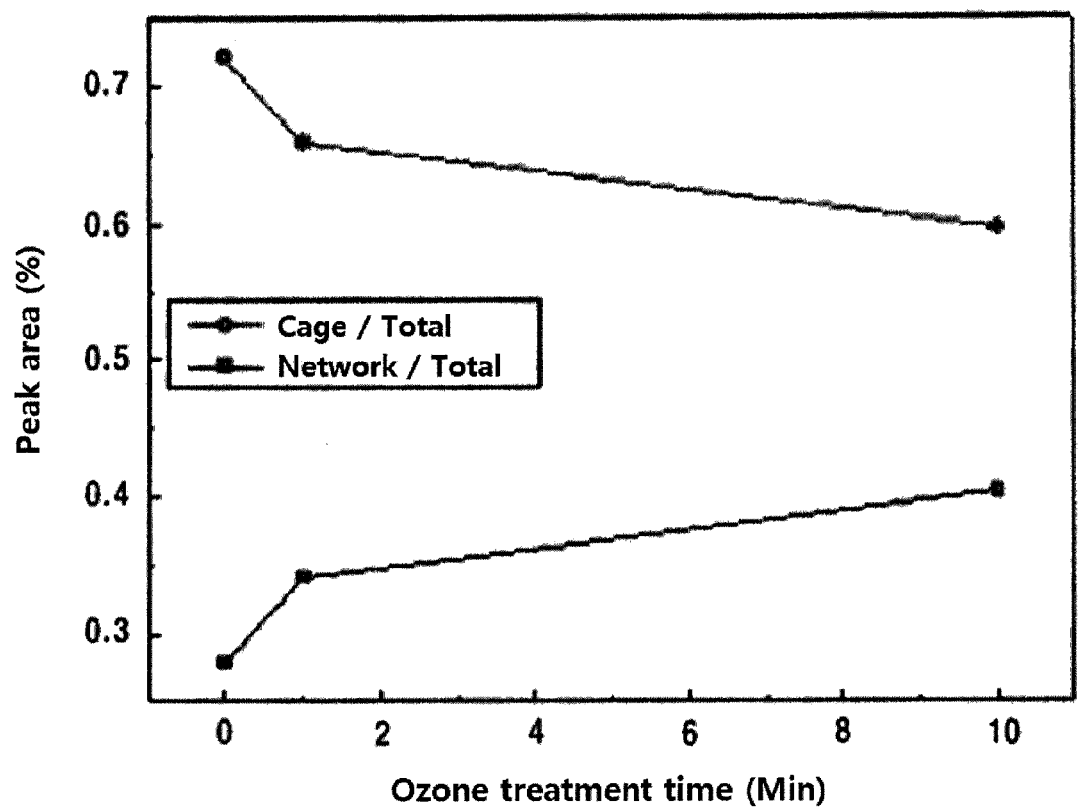
Figure 12B:
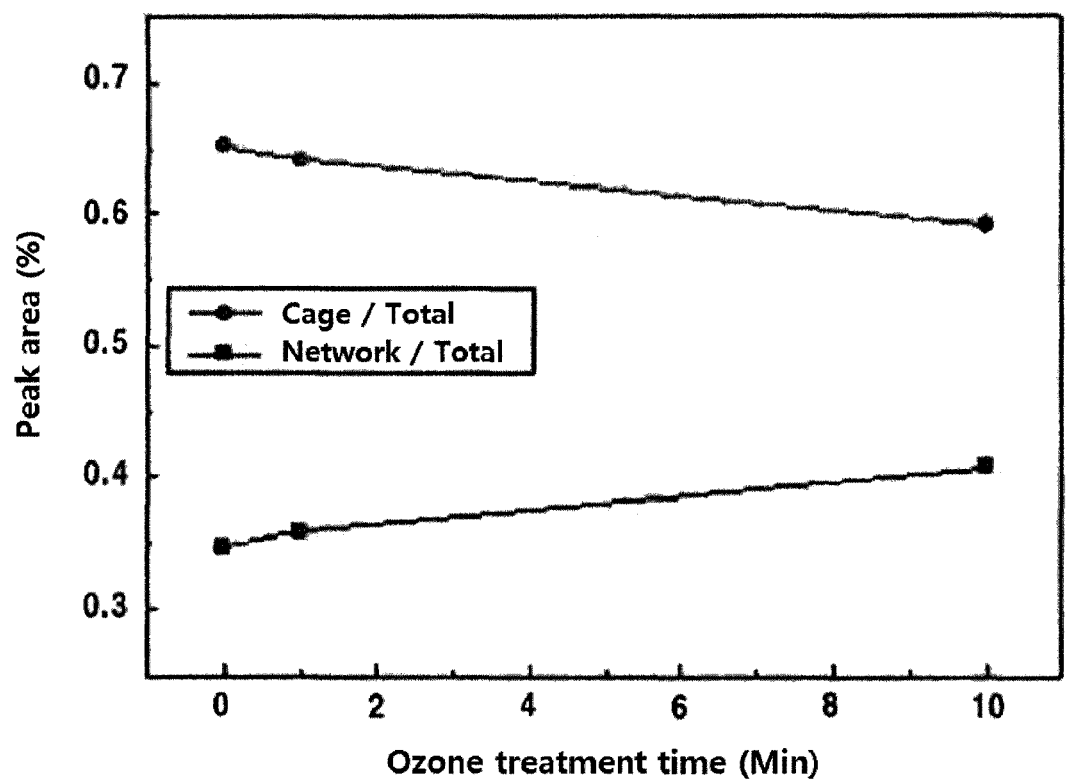
Figure 12C:
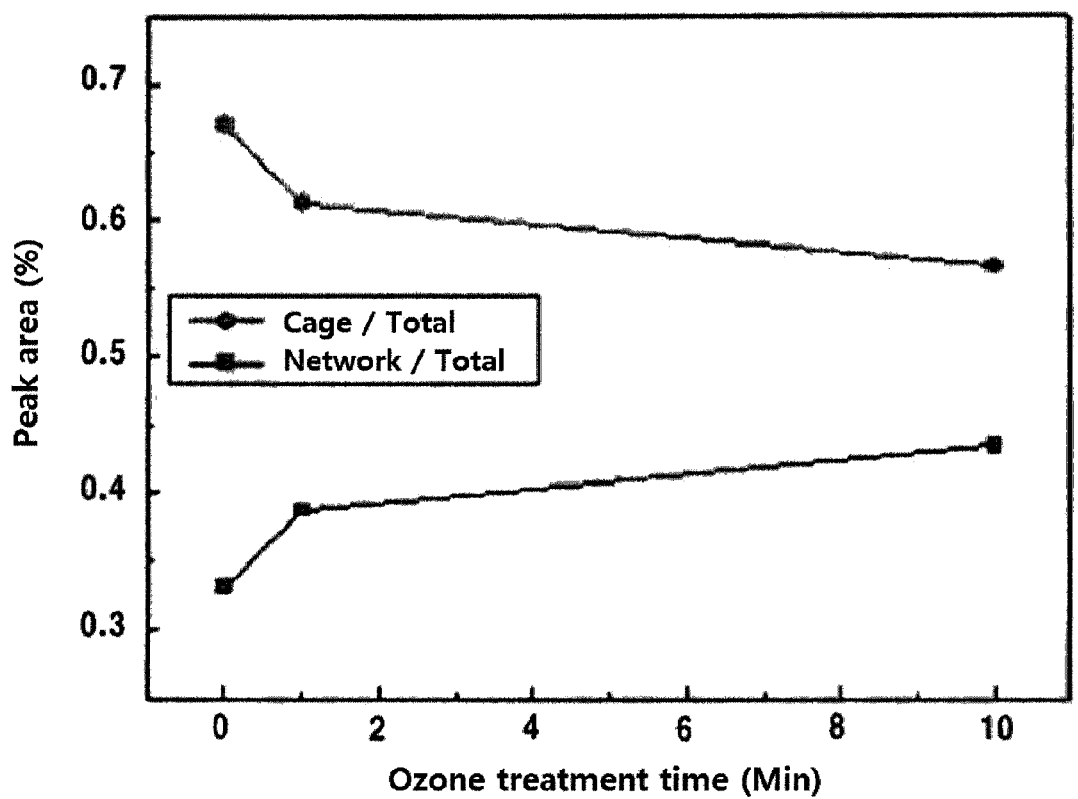
Figure 12D:
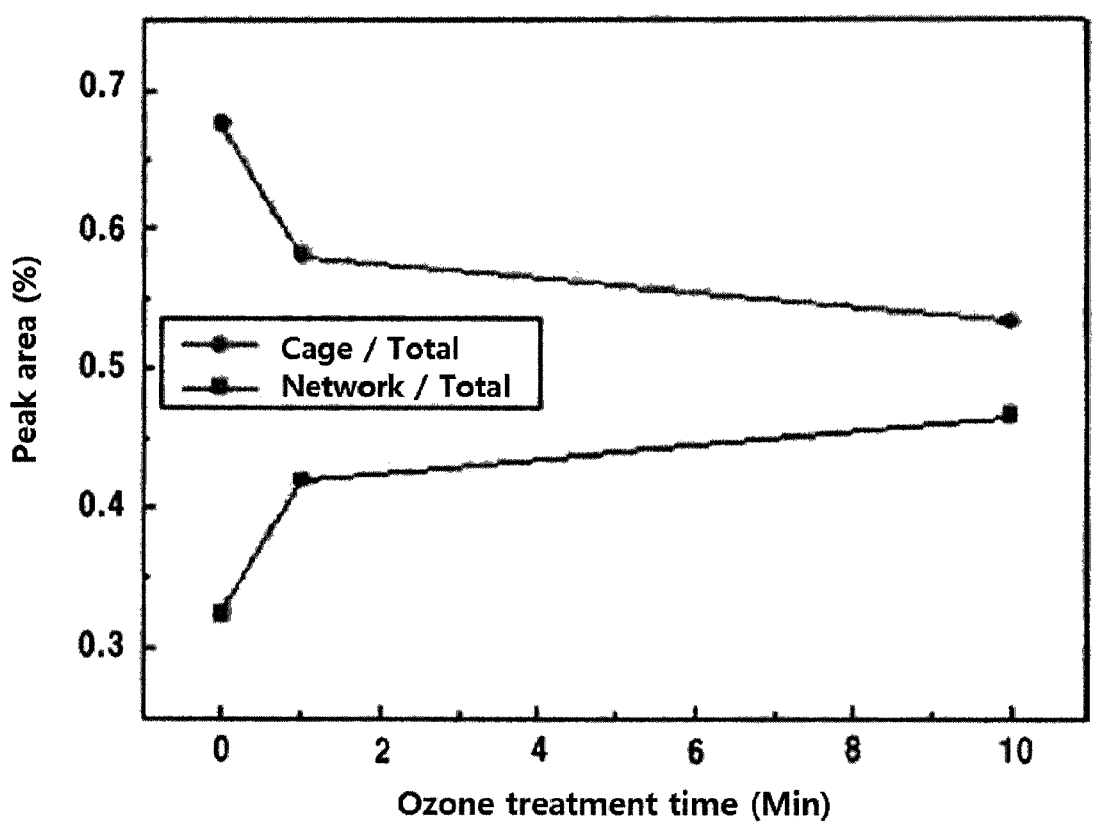

In order to find a change in a mechanical strength depending on an ozone treatment time, an elastic modulus and a hardness of an ultra-low dielectric thin film ozone-treated for about 0 minute, about 1 minute, and about 10 minutes were measured. As depicted in FIG. 10, as an ozone treatment time was increased, a mechanical strength was sharply increased. The mechanical strength was caused by a Si—O—Si bonding additionally formed by the ozone treatment. That is, an end of a porogen was substituted by Si—OH in the ozone treatment resulting in an increase in reactivity between the matrix and the porogen, and a Si—O—Si structure formed as a result of the reaction therebetween caused an improvement of mechanical strength.

<FT-IR Peak Deconvolution>

A peak of a Si—O—Si structure shown in a range of from about 950 cm$^{-1}$ to about 1250 cm$^{-1}$ of FT-IR was deconvoluted and a change in a structure depending on an ozone treatment time for each content. FIG. 11 shows an area ratio of a network structure and a cage structure by dividing an area ratio obtained by deconvolution into a suboxide structure, the network structure, and the cage structure by an area of the suboxide structure. Since an ozone treatment at about 110° C. only affected Si—OCH$_3$ and Si-OEt, there was no change in a T-structure, i.e. the suboxide structure. This could be seen from a result of a FT-IR analysis and a $^{29}$Si-NMR analysis. There was an increase in the network and the cage structures on the basis of a chemical structure of SiO$_2$. That is, a Si—O—Si structure was increased due to additional formation of a Si—OH group.

FIG. 12, referring to FIG. 11, shows a relative ratio of a network structure and a cage structure by dividing a change in each structure by the sum of the network structure and the cage structure. Taken as a whole, there was an increase in the network and cage structures each including a Si—O—Si structure (FIG. 11), but relatively, there was an increase in the network structure and there was a decrease in the cage structure (FIG. 12). That is, an increase in a mechanical strength through an ozone treatment was caused by an increase in a ratio of the network structure.

<Dielectric Constant>

FIG. 13 shows a dielectric constant of a thin film ozone-treated at about 110° C. for about 0 minute, about 1 minute, and about 10 minutes. As an ozone treatment time was increased, there was an increase in dielectric constant for each content due to an increase in porous ratio. As a porogen content was increased, there was a greater increase in dielectric constant. This was because a porogen had more Si—OCH$_3$ groups at its ends than a matrix and formed more Si—O—Si structures, resulting in a decrease in porous ratio. As a result, as for a low dielectric thin film which was not ozone-treated, in case of a porogen content of about 60 volume %, a dielectric constant was decreased from about 2.9 to about 2.11. As for a low dielectric thin film ozone-treated for about 10 minutes, in case of a porogen content of about 60 volume %, a dielectric constant was about 2.51. As for a low dielectric thin film ozone-treated for about 1 minute, a dielectric constant was about 2.30.

As described above, it could be seen from an ozone treatment at various temperatures that the low dielectric thin film was silicon-oxidized (SiO$_2$) by an ozone treatment at about 250° C. or more, and there were remaining —OH groups which did not react. These —OH groups caused an increase in a refractive index and a dielectric constant. Thus, by analyzing an ozone treatment effect on a matrix and a porogen, an optimum temperature (110° C.) for maximizing reactivity between the matrix and the porogen was found. In particular, at a temperature of about 110° C., a methoxy group at an end of the porogen was substituted by an —OH group, and a Si—O—Si structure was increased through a sol-gel reaction. As a result, an ultra-low dielectric thin film having a slightly increased dielectric constant and a high mechanical strength were prepared. In case of a porogen content of about 60 volume %, an elastic modulus was about 11.25 GPa, a hardness was about 1.36 GPa, and a dielectric constant was about 2.30.

Accordingly, in accordance with the present invention, an ultra-low dielectric material having a high mechanical strength and a low dielectric constant was prepared through a high-temperature ozone treatment during a heating process, and a cause thereof was found by using various analyzers. The following Table 1 shows properties of a nanoporous ultra-low dielectric material prepared through the above-described ozone treatment. In accordance with the present invention, an ultra-low dielectric material having a dielectric constant of about 2.3 or less, an elastic modulus of about 10 GPa or more, and a hardness of about 1.2 GPa or more was prepared, and the ultra-low dielectric material having such properties is a world-class material which can be applied to a next-generation semiconductor of 36 nm or more.

TABLE 1

| Condition | | k | E(GPa) | H(GPa) |
|---|---|---|---|---|
| No ozone treatment | | 2.17 | 9.3 | 1.1 |
| Ozone treatment | 110° C., 1 min | 2.30 | 11.25 | 1.36 |
| Ozone treatment | 110° C., 10 min | 2.51 | 14.21 | 1.71 |

The above description of the present invention is provided for the purpose of illustration, and it would be understood by those skilled in the art that various changes and modifications may be made without changing technical conception and essential features of the present invention. Thus, it is clear that the above-described examples are illustrative in all aspects and do not limit the present invention. For example, each component described to be of a single type can be implemented in a distributed manner. Likewise, components described to be distributed can be implemented in a combined manner.

The present invention has been explained in detail with reference to the example as above, but the present invention can be modified and changed in various ways by those skilled in the art within the scope of the inventive concept described in the following claims.

What is claimed is:

1. A method for preparing a nanoporous ultra-low k dielectric thin film having a dielectric constant of about 2.3 or less, an elastic modulus of about 10 GPa or more, and a hardness of about 1.2 GPa or more, the method comprising:
    preparing a mixture of an organic silicate matrix-containing solution and a reactive porogen-containing solution,
        wherein the organic silicate matrix includes a copolymer of methyltrialkoxysilane and bis(trialkoxysilyl)alkane, and wherein the reactive porogen includes a compound selected from the group consisting of a glass polyol-based compound, a reducing sugar-based compound, and combinations thereof, a hydroxyl end group of the compound being substituted by a trialkoxysilyl-alkyl group;

coating the mixture on a substrate to form a thin film; and heating the thin film with an ozone treatment by flowing ex-situ generated ozone during the heating at a temperature range of from about 100° C. to about 200° C. to prevent Si—$CH_3$ of the organic silicate matrix from being converted to Si—OH, and wherein the mixture includes the reactive porogen-containing solution of from about 20 volume % to about 60 volume % with respect to the organic silicate matrix-containing solution.

2. The method of claim 1, wherein the coating the mixture is performed by spin coating.

3. The method of claim 1, wherein the heating includes a curing process.

4. The method of claim 3, wherein the heating includes:
a first curing process to remove a solvent and to induce a condensation reaction of the organic silicate matrix;
a second curing process performed at a temperature higher than the first curing process to introduce a nanopore and to increase a curing density; and
a final heating process performed at a temperature higher than the second curing process.

5. The method of claim 4, wherein the ozone treatment is performed during the first curing process or the second curing process.

* * * * *